US 6,534,711 B1

(12) United States Patent
Pollack

(10) Patent No.: US 6,534,711 B1
(45) Date of Patent: Mar. 18, 2003

(54) ENCAPSULATION PACKAGE AND METHOD OF PACKAGING AN ELECTRONIC CIRCUIT MODULE

(75) Inventor: Richard Stephen Pollack, Boulder, CO (US)

(73) Assignee: The Goodyear Tire & Rubber Company, Akron, OH (US)

( * ) Notice: Subject to any disclaimer, the term of this patent is extended or adjusted under 35 U.S.C. 154(b) by 0 days.

(21) Appl. No.: 09/622,548

(22) PCT Filed: Apr. 14, 1998

(86) PCT No.: PCT/US98/07578
§ 371 (c)(1),
(2), (4) Date: Aug. 17, 2000

(87) PCT Pub. No.: WO99/53740
PCT Pub. Date: Oct. 21, 1999

(51) Int. Cl.[7] .............................. H01L 23/28
(52) U.S. Cl. ................ 174/52.2; 264/272.11; 257/687; 257/787
(58) Field of Search .............. 174/52.2; 264/272.11; 438/112, 126, 127, 124; 257/678, 685, 687, 698, 787

(56) References Cited

U.S. PATENT DOCUMENTS

| 3,703,651 A | 11/1972 | Blowers |
| 4,044,371 A | 8/1977 | Abdelrahman et al. |
| 4,317,216 A | 2/1982 | Kaegebein |
| 4,567,459 A | 1/1986 | Folger et al. |
| 4,578,992 A | 4/1986 | Galasko et al. |
| 4,701,826 A | 10/1987 | Mikkor |
| 4,749,993 A | 6/1988 | Szabo et al. |
| 4,758,969 A | 7/1988 | Andre et al. |

(List continued on next page.)

FOREIGN PATENT DOCUMENTS

| EP | 0289439 | 11/1988 |
| EP | 0358122 | 3/1990 |
| EP | 0406174 | 1/1991 |
| WO | WO87/00127 | 1/1987 |
| WO | WO90/12474 | 10/1990 |
| WO | WO92/15105 | 9/1992 |
| WO | WO94/06640 | 3/1994 |
| WO | WO95/22467 | 8/1995 |
| WO | WO96/06747 | 3/1996 |
| WO | WO96/28311 | 9/1996 |
| WO | WO96/32829 | 10/1996 |

OTHER PUBLICATIONS

P. Durmmenacher and H. Oguey Smart Temperature Sensor in CMOS Technology Sensors and Actuators, Mar. 1990 pp 636–638.

*Primary Examiner*—Dean A. Reichard
*Assistant Examiner*—Carmelo Oliva
(74) *Attorney, Agent, or Firm*—Howard M. Cohn

(57) ABSTRACT

A package (104) for encapsulating electronic components (102, 122, 550, 660) has at least two chambers (112, 212). Electronic components and modules within the chambers are interconnected by a leadframe (130) extending between the two chambers. One chamber may surround (FIGS. 1A, 2A) the other chamber, or it may be adjacent the other chamber (FIGS. 4, 4A, 8A, 9A). The sidewall (310) of one chamber (314) may be higher than the sidewall (308) of the other chamber (312). Each of the chambers may individually be filled with encapsulating material (713, 715). Temporary connections (742) to the leadframe may be made after one chamber is filled with encapsulating material, in an unfilled other chamber of the package which is subsequently filled with encapsulating material. A portion of a leadframe may extend to the exterior of the package. Openings (656, 658) may be provided in an external surface of the package for making connections with external components (650). The electronic components may include an RF-transponder and a pressure sensor, and the package may be mounted within a pneumatic tire (1012).

11 Claims, 11 Drawing Sheets

U.S. PATENT DOCUMENTS

| | | |
|---|---|---|
| 4,857,893 A | 8/1989 | Carroll |
| 4,858,074 A | 8/1989 | Mallet et al. |
| 4,911,217 A | 3/1990 | Dunn et al. |
| 4,970,497 A | 11/1990 | Broadwater et al. |
| 5,039,878 A | 8/1991 | Armstrong et al. |
| 5,063,307 A | 11/1991 | Zommer |
| 5,106,785 A * | 4/1992 | Rauchmaul et al. ... 264/272.11 |
| 5,181,975 A | 1/1993 | Pollack et al. |
| 5,213,416 A | 5/1993 | Neely et al. |
| 5,218,861 A | 6/1993 | Brown et al. |
| 5,239,126 A | 8/1993 | Oshiba |
| 5,239,406 A | 8/1993 | Lyman |
| 5,451,959 A | 9/1995 | Schuermann |
| 5,480,840 A * | 1/1996 | Barnes et al. ................. 29/836 |
| 5,504,659 A | 4/1996 | Acatay et al. |
| 5,540,092 A | 7/1996 | Handfield et al. |
| 5,566,055 A * | 10/1996 | Salvi, Jr. ................. 174/35 R |
| 5,581,023 A | 12/1996 | Handfield et al. |
| 5,627,406 A | 5/1997 | Pace |
| 5,639,163 A | 6/1997 | Davidson et al. |
| 5,661,651 A | 8/1997 | Geschke et al. |
| 5,686,858 A | 11/1997 | Malherbe |
| 5,694,300 A * | 12/1997 | Mattei et al. ............. 174/35 R |
| 5,706,565 A | 1/1998 | Sparks et al. |
| 5,712,609 A | 1/1998 | Mehregany et al. |

\* cited by examiner

ENCAPSULATION PACKAGE AND METHOD OF PACKAGING AN ELECTRONIC CIRCUIT MODULE

TECHNICAL FIELD OF THE INVENTION

The invention relates to the interconnection and packaging of electronic components and, more particularly, to a circuit module which may include a sensor and be disposed in a harsh environment.

BACKGROUND OF THE INVENTION

As used herein, the term "circuit module" refers to an interconnection substrate such as a printed circuit board (PCB) having electronic components mounted thereto. A PCB is a multi-layer substrate, having alternate layers of insulating material and conductive material. The conductive material of a conductive layer is patterned to have conductive "lines" or "traces" for routing signals (and power) from one location on the PCB to another location on the PCB. In the case of multiple conductive layers, typically at least one of these layers is disposed on a surface (e.g., the "top" surface) of the PCB. Additionally, the conductive layer on the top surface of the PCB may be patterned to have "pads" which serve as terminals for (i) connecting to leads of electronic components mounted to the PCB, or (ii) making connections to external instrumentalities such as sockets. In this manner, electronic components which are mounted to the PCB may be interconnected to one another via pads on the top surface of the PCB and conductive traces of the PCB.

Examples of electronic components which may be incorporated in a circuit module include:
  (a) "active" electronic components such as integrated circuit (IC) devices, and the like;
  (b) "passive" electronic components such as resistors, capacitors, and inductors (including transformers), and the like;
  (c) switches, relays and the like; and
  (d) sensors, transducers and the like.

The electronic components incorporated in a circuit module may either be "packaged" or "bare" (not packaged).

An example of a "packaged electronic component" is a semiconductor memory device (e.g., dynamic random access memory, or DRAM, chip) which has been mounted and electrically connected to a leadframe having a plurality of elongate conductive members ("fingers") and overmolded with plastic. Outer portions of the leadframe fingers extend (protrude) out of the molded plastic body and can be connected to the conductive pads on an interconnection substrate (PCB). In this manner, a plurality of plastic-packaged DRAM memory devices can be mounted and connected to a PCB, thereby forming a memory module. The memory module can be plugged into a socket which is mounted on another interconnection substrate, such as a "motherboard" of a computer system, with conductive pads disposed on one or both surfaces of the memory module making electrical contact with resilient contact members in the socket.

An example of a "bare electronic component" is a semiconductor device which is glued (using "die attach" adhesive) onto an interconnection substrate and electrically connected thereto with fine wires extending between pads on the semiconductor device and pads on the interconnection substrate. In order to protect the electronic component and the wires, it is known to apply a dollop of "glob-top" epoxy, or the like, over the electronic component and the fine wires.

A well-known technique for making such connections to semiconductor devices is "wirebonding". An exemplary wirebonding technique involves:
  a. feeding a fine (e.g., 1 mil diameter) gold (or gold alloy) bond wire through a capillary which is located above a terminal (pad) of an interconnection substrate or electronic component mounted thereto;
  b. bonding (e.g., welding) an end of the bond wire to the terminal using a combination of pressure and heat or ultrasonic vibration;
  c. withdrawing the capillary so that the bond wire "pays out" of the capillary, thereby forming some slack in the bond wire;
  d. moving the interconnection substrate (or, conversely, the capillary), so that the capillary is located above another terminal (pad) on the electronic component or interconnection substrate;
  e. bonding an intermediate portion of the bond wire to the other terminal; and
  f. severing the bond wire, thereby resulting in a "loop" of bond wire extending between the terminal (pad) on the electronic component and the terminal (pad) on the interconnection substrate.

The present invention draws upon many of the techniques described hereinabove to effect a novel technique for packaging electronic circuit modules and components. Prior to proceeding with a description of the invention, certain additional relevant aspects of electronic packaging should be understood.

There is often a need to test or, more broadly, exercise electronic components and circuit modules prior to their being shipped for installation (e.g., assembly into systems) to ensure that they will perform to their design specification. This would include, in the case of electronic components and circuit modules that can and need to be calibrated or personalized, calibrating or personalizing the electronic components and circuit modules.

Returning to the example of a DRAM device which has been overmolded with plastic and which has outer portions of leadframe fingers protruding out of the molded plastic body, the DRAM device can be tested by making "temporary" electrical connections to portions of the leadframe fingers which protrude from the package body, using pins, needles and the like. An example of a pin suitable for making a temporary electrical connection to a terminal (in this example, the terminal being the protruding portion of the leadframe finger) of an electronic component is a so-called "pogo" pin, which is generally a pin having an inner part protruding from an outer part, and a spring maintaining the inner part biased to an extended position. Or, in the case of a memory module having a plurality of plastic-packaged DRAM memory devices mounted and connected to a PCB, the entire module can be tested by plugging the module into a test socket of a test system, the test socket making temporary electrical connections to the PCB and "accessing" the components mounted to the PCB via the conductive traces of the PCB.

Personalizing or calibrating a packaged circuit module similarly involves, in a broad sense, having access to protruding terminals of the module. For example, the module may have a non-volatile memory (NVM) component which can be programmed by providing signals to external terminals of the module. Or, for example, a module can be programmed via personalization components such as DIP-switches which are part of the module and accessible from external the module.

In contrast thereto, consider the case of a packaged circuit module which in its final form does not have any terminals protruding from its exterior or access to personalization components from its exterior—not even power connections (e.g., battery terminals). The problem is, how to exercise the module. An example of such a packaged circuit module lacking the inherent ability of be exercised or personalized in its final form is a transponder module that is fully encased to isolate its electronic components from the ambient environment, save for a sensor (e.g., a temperature sensor) that is exposed to the ambient environment on the exterior of the packaged circuit module.

As will become evident, the present invention is directed to a package for encapsulating electronic modules and components having at least two chambers (cavities).

European Patent No. EP-A-0289439 discloses a single chamber of an enclosure which is partially filled over a first circuit module, thereby encapsulating a "first chamber," and leaving the unfilled remainder of the chamber as a "second chamber." A second circuit module is placed on top of the first filling, and then the second chamber is filled with a second filling which covers the second circuit module. Appropriate interconnections between circuit modules and external connectors are made by conductors embedded in the first and second fillings, and thereby passing between chambers.

U.S. Pat. No. 5,239,126 (Sony, 1993) discloses a high-frequency circuit package including a conductive substrate, and upper and lower shielding cases which define upper and lower shielding chambers, respectively. High-frequency circuits are mounted on the upper and lower surfaces of the conductive substrate within the upper and lower chambers, respectively. This patent, incorporated in its entirety by reference herein, is cited as an example of an electronic package having two chambers.

A similar package with three shielded chambers is seen in U.S. Pat. No. 5,504,659 which discloses a structure for she shielding of electronic components from outside electromagnetic fields. The outside housing holds a single printed circuit board which separates a "polluted" space from a "clean" space and accommodates the components of the device to be shielded itself. In FIG. 2, the polluted space (24) forms one chamber, and the housing forms a shielding partition which divides off a clean space (28) forming a second chamber with through contacts for lines connecting between the chambers. The printed circuit board also serves to shield the first two chambers from a third clean space (32) on the other side of the printed circuit board in the housing.

U.S. Pat. No. 5,627,406 (Pace, 1997), incorporated in its entirety by reference herein, discloses an electronic packaging module. A hybrid circuit (310) forms a base and has protuberances (330) and metallic pads (331) on its surface. Semiconductor devices (340) and other components (341) are bonded to the protuberances and pads. A metal or ceramic frame (350) having openings for the semiconductor devices and other components is disposed on the surface of the base and fits around the semiconductor devices and other components. Plugs (370) fit inside the openings in the frame, contact the back of the semiconductor devices, and are bonded to the frame to seal the module. Although this packaging module is not an encapsulation module, it is referenced as illustrative of a package having two (or more) side-by-side cavities (or chambers) with electronic components disposed in each of the cavities.

In some cases, a circuit module is intended to be disposed in a "harsh" environment, and it is desirable to isolate the electronic components of the circuit module from the environment. An example of such an application for a circuit module is an RF transponder which is disposed within a pneumatic tire of a vehicle. Attention is directed, for example, to the PNEUMATIC TIRE HAVING INTEGRATED CIRCUIT TRANSPONDER AND PRESSURE TRANSDUCER described in commonly-owned U.S. Pat. No. 5,218,861, incorporated in its entirety by reference herein.

OBJECT OF THE INVENTION

It is an object of the present invention to provide an improved electronic module and method for packaging the improved electronic module as defined in one or more of the appended claims and, as such, having the capability of being constructed to accomplish one or more of the following subsidiary objects.

It is therefore an object of the present invention to provide an improved technique for packaging electronic circuit modules.

It is another object of the present invention to provide an improved electronic module package.

It is another object of the present invention to provide a technique for packaging an electronic circuit module which permits the electronic module to be encapsulated (potted), then exercised (e.g., calibrated), then separately potting additional electronic components disposed within the package.

SUMMARY OF THE INVENTION

According to the invention, a package for encapsulating electronic components has at least two chambers (cavities). The chambers are open at their tops so that the chambers, and electronic components and modules disposed within the chambers, can be at least partially filled with encapsulating material (potting compound). The chambers are suitably molded from a plastic material such as thermoset epoxy, polyphenylene sulfide, Ryton TM, or the like, by an injection molding process.

According to an aspect of the invention, a leadframe is disposed within the package and has elongate conductive elements (leadframe fingers) extending from a one of the chambers into an other of the chambers. In this manner, an electronic component or module disposed within a one of the chambers can be interconnected with an electronic module or component disposed within an other of the chambers.

According to an aspect of the invention, the chambers may separately (individually) be filled with encapsulating material. This permits, for example, an electronic module disposed within a one of the chambers and connected to portions of leadframe fingers within that cavity to be potted with encapsulating material, then electrically exercised (e.g., calibrated or personalized) by making temporary electrical connections (e.g., with "pogo pins") from an external instrumentality (e.g., a test apparatus) to portions of the leadframe fingers extending into an other of the chambers. The potted module within the one of the chambers can thus be exercised, either with or without an electronic component disposed in the other of the chambers. After exercising the potted module, the other chamber and electronic component disposed therein can be potted without "disturbing" the previously-exercised, previously-potted module.

In an embodiment of the invention, an outer one of two chambers surrounds an inner one of two chambers. This embodiment includes having a one chamber surrounding an other chamber which, in turn, surrounds yet another chamber.

In another embodiment of the invention, a one chamber is adjacent another chamber. This includes having more than one chamber adjacent another chamber, such as two chambers on opposite sides of an other chamber, or three chambers adjacent the sides of a triangular chamber, or four chambers adjacent the sides of a rectangular chamber.

According to an aspect of the invention, the sidewalls of a one of the chambers may be higher than the sidewalls of an other of the chambers. In this manner, the chamber having the higher sidewalls can, for example, be fully filled with encapsuling material while minimizing a risk of the encapsulating material spilling over into a neighboring chamber.

According to an aspect of the invention, a portion of the leadframe may extend through an outer wall of the package to the exterior of the package.

According to another aspect of the invention, openings may be provided in an external surface (outer wall) of the package for making connections with components which are external to the package.

In a representative application for the package, the electronic module and components contained (and potted) within the package comprise an RF-transponder and a pressure sensor, and the entire package assembly may be mounted within a pneumatic tire.

Other objects, features and advantages of the invention will become apparent from the description that follows.

BRIEF DESCRIPTION OF THE DRAWINGS

Reference will be made in detail to preferred embodiments of the invention, examples of which are illustrated in the accompanying drawings. The drawings are intended to be illustrative, not limiting.

Certain elements in selected ones of the drawings may be illustrated not-to-scale, for illustrative clarity.

Often, similar elements throughout the drawings may be referred to by similar references numerals. For example, the element 199 in a figure (or embodiment) may be similar in many respects to the element 299 in an other figure (or embodiment). Such a relationship, if any, between similar elements in different figures or embodiments will become apparent throughout the specification, including, if applicable, in the claims and abstract.

In some cases, similar elements may be referred to with similar numbers in a single drawing. For example, a plurality of elements 199 may be referred to as 199a, 199b, 199c, etc.

The cross-sectional views presented herein may be in the form of "slices", or "near-sighted" cross-sectional views, omitting certain background lines which would otherwise be visible in a true cross-sectional view, for illustrative clarity.

Figure 1A:
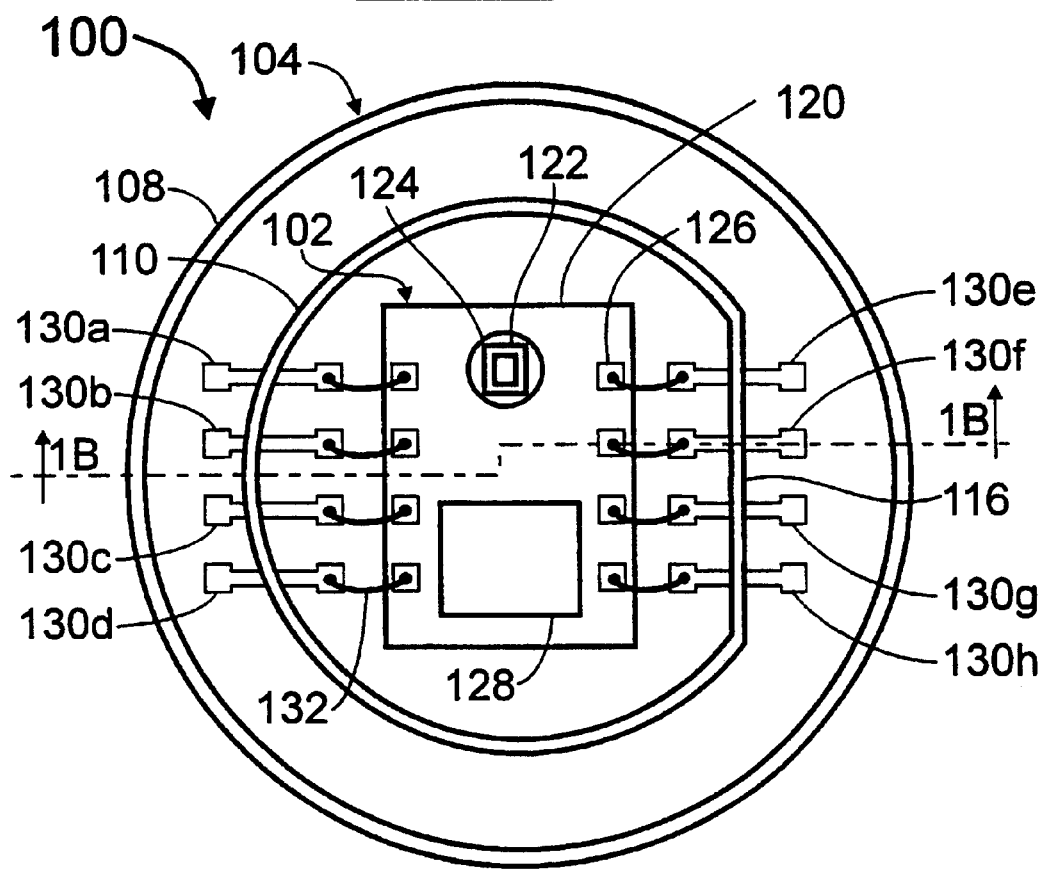
Figure 1B:
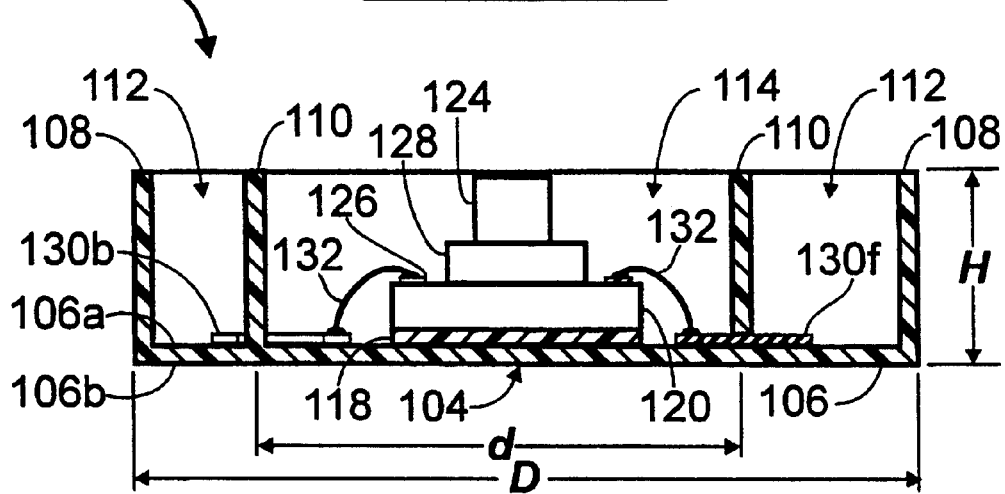
Figure 2A:
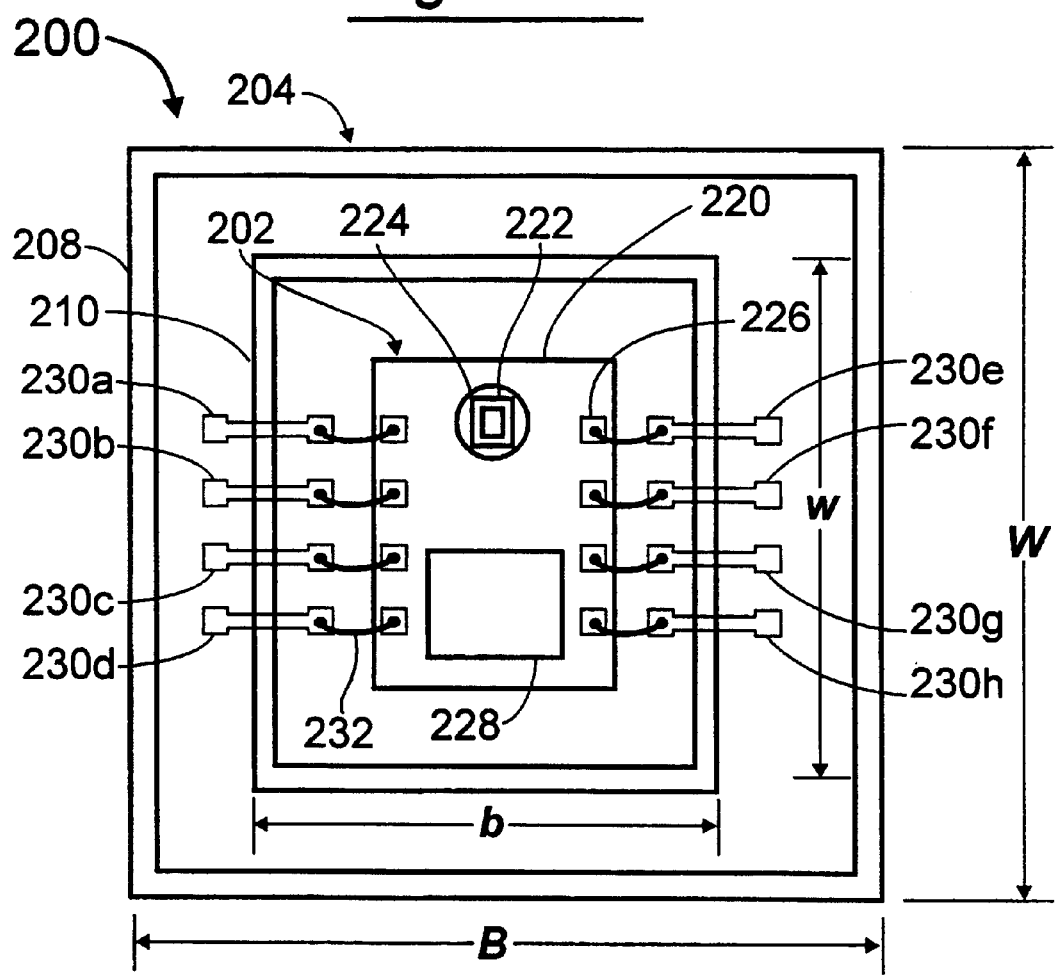
Figure 2B:
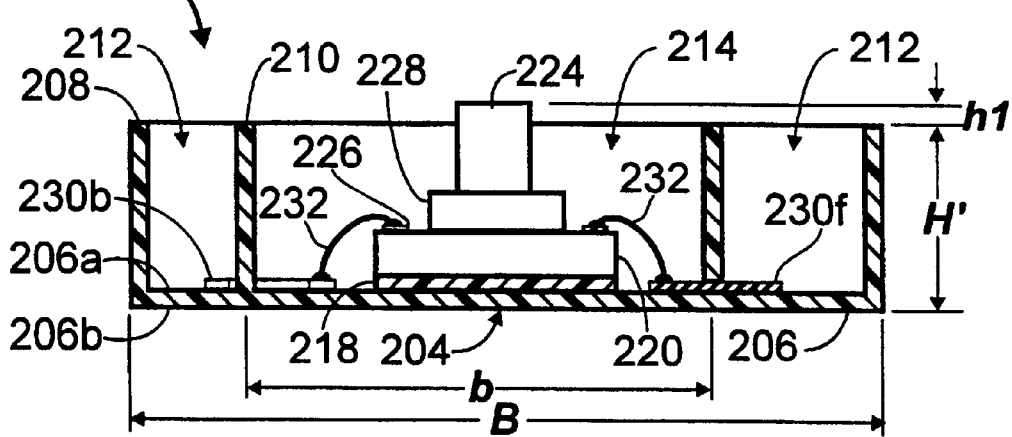
Figure 3:
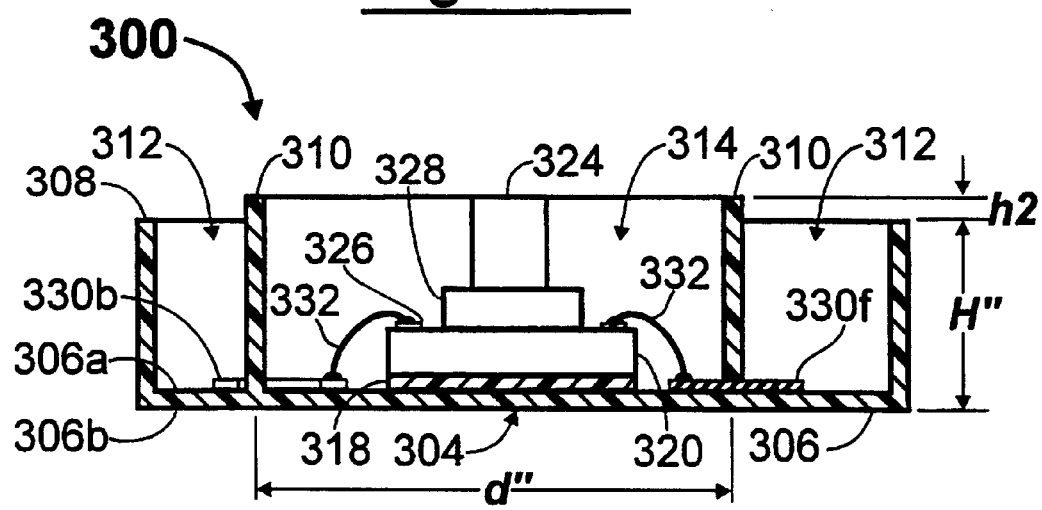
Figure 4:
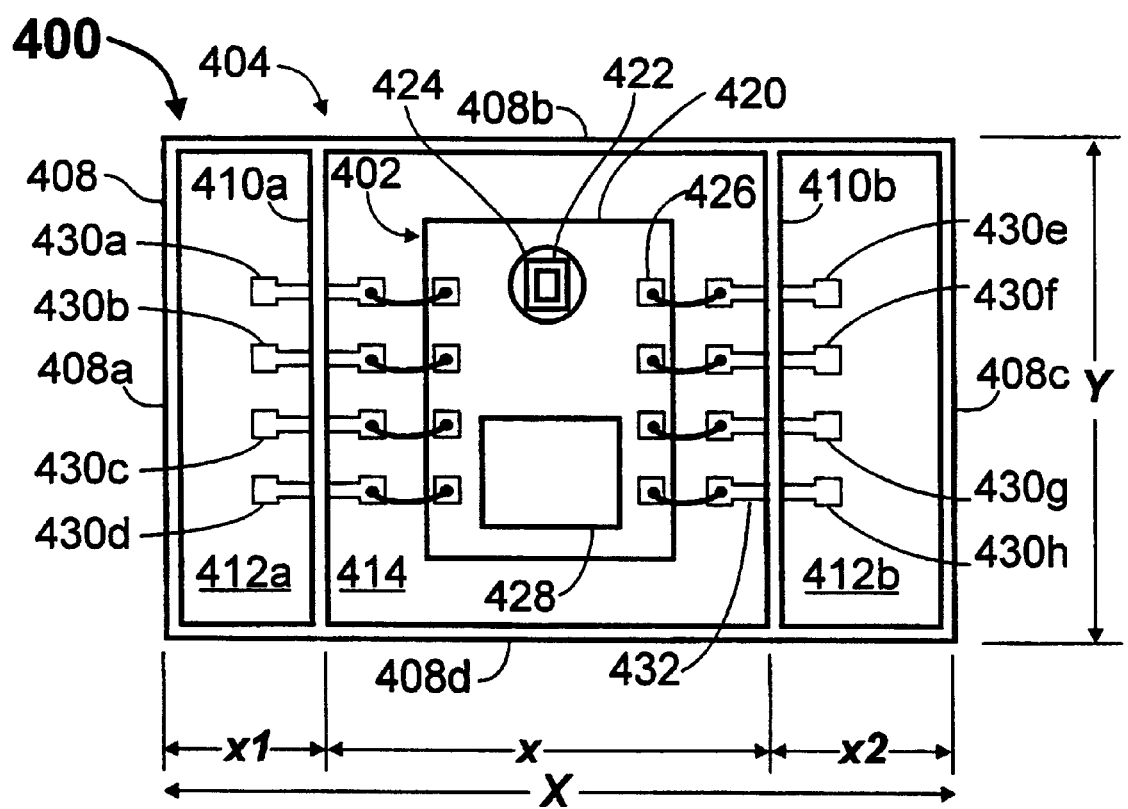
Figure 4A:
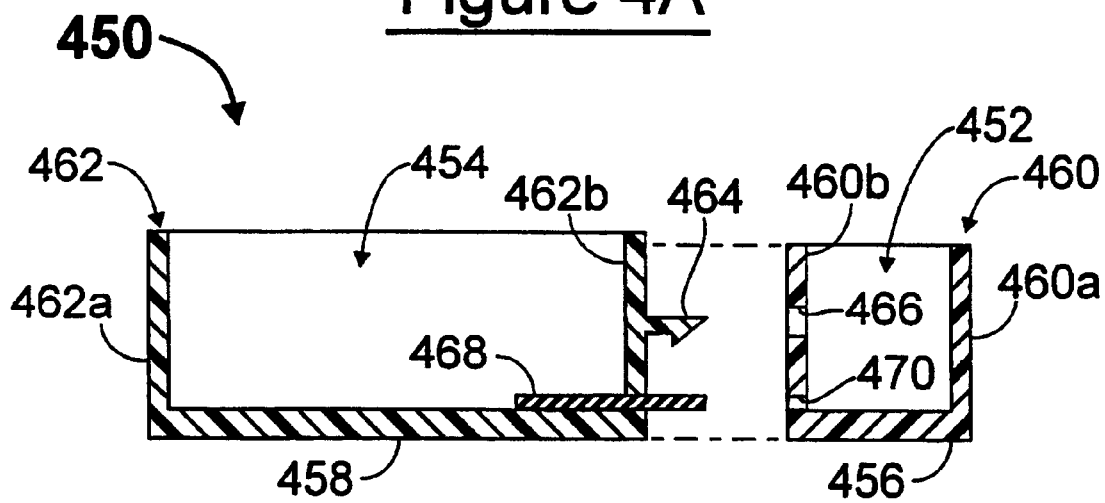
Figure 4B:
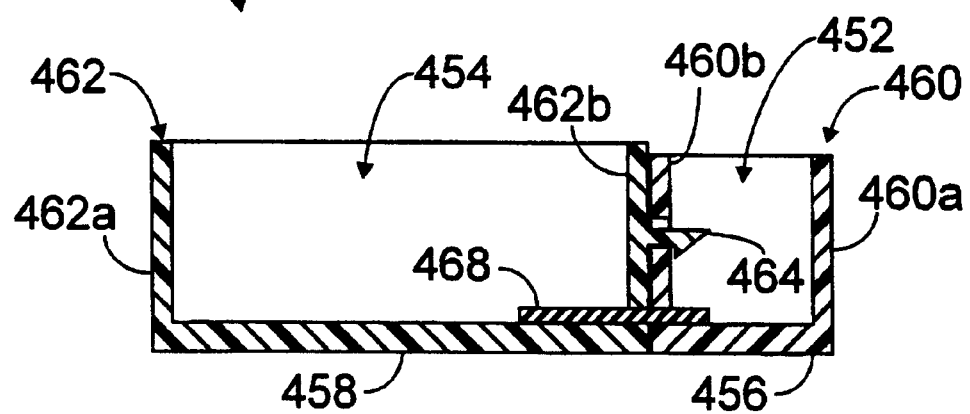

The structure, operation, and advantages of the present preferred embodiment of the invention will become further apparent upon consideration of the following description taken in conjunction with the accompanying drawings, wherein:

FIG. 1A is a top plan view of an embodiment of the encapsulation package assembly of the present invention;

FIG. 1B is a side cross-sectional view of the encapsulation package assembly of FIG. 1A, taken on a line 1B—1B through FIG. 1A, according to the invention;

FIG. 2A is a top plan view of an alternate embodiment of the encapsulation package assembly of the present invention;

FIG. 2B is a side cross-sectional view of an alternate embodiment of the encapsulation package assembly shown in FIG. 2A of the present invention;

FIG. 3 is a side cross-sectional view of an alternate embodiment of the encapsulation package assembly of the present invention;

FIG. 4 is a top plan view of all alternate embodiment of the encapsulation package assembly of the present invention;

FIG. 4A is an exploded, side cross-sectional view of an alternate embodiment of the encapsulation package assembly of the present invention;

FIG. 4B is an assembled, side cross-sectional view of the alternate embodiment of the encapsulation package assembly of FIG. 4A, according to the invention.

Figure 5A:
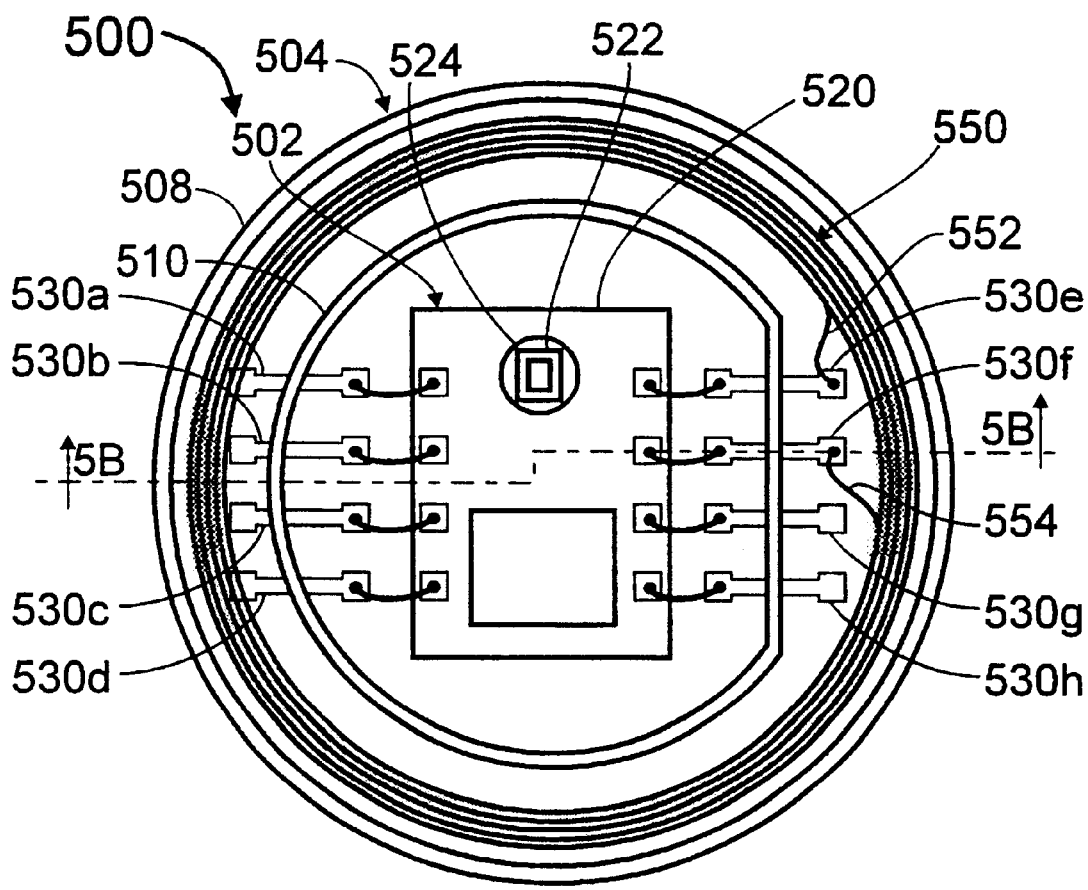
Figure 5B:
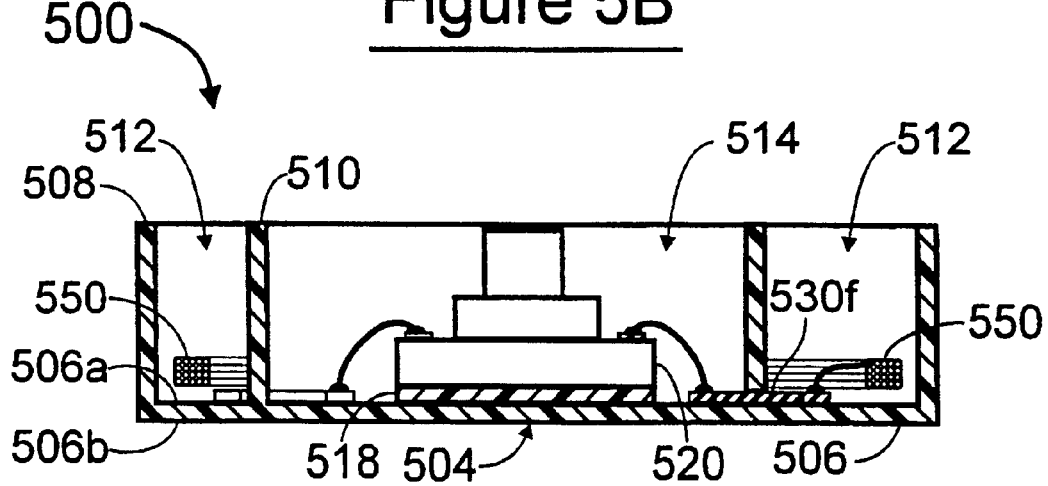
Figure 6A:
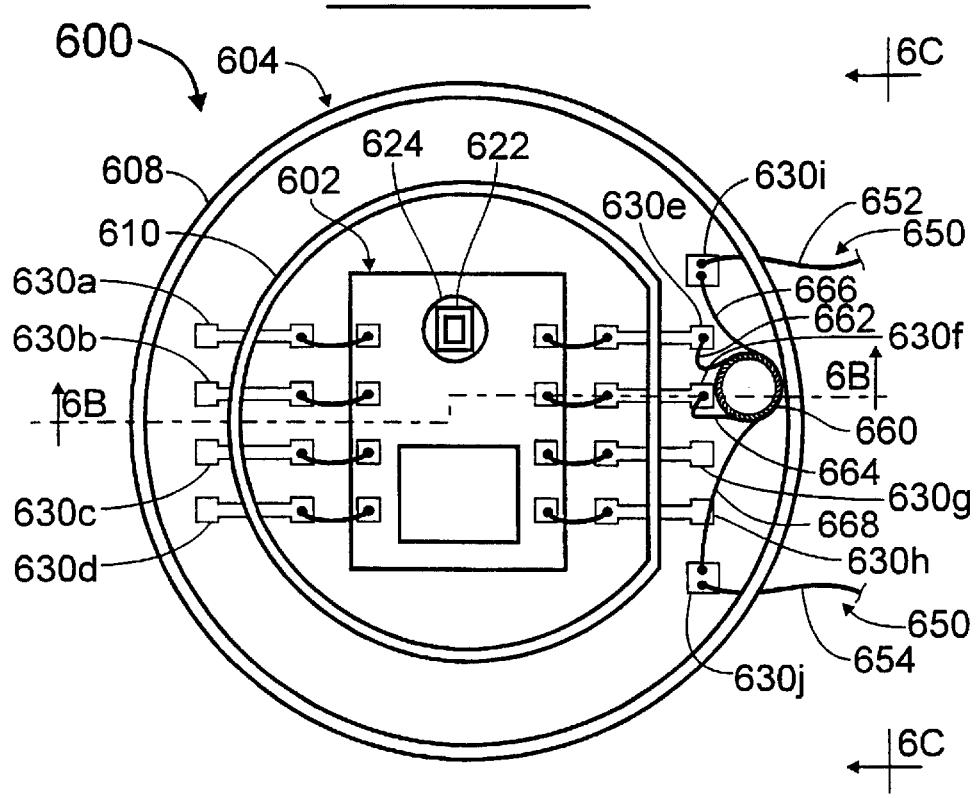
Figure 6B:
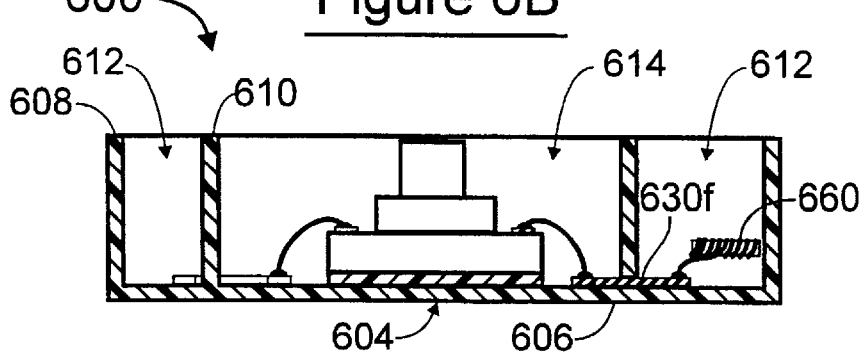
Figure 6C:
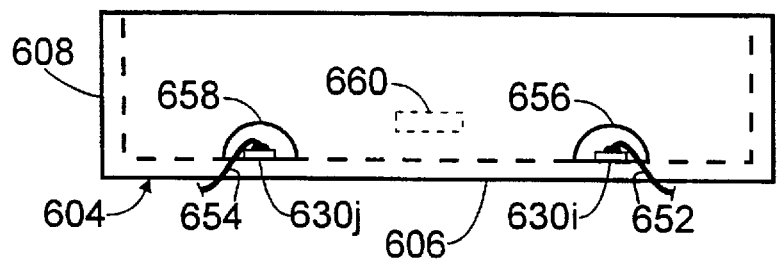
Figure 8A:
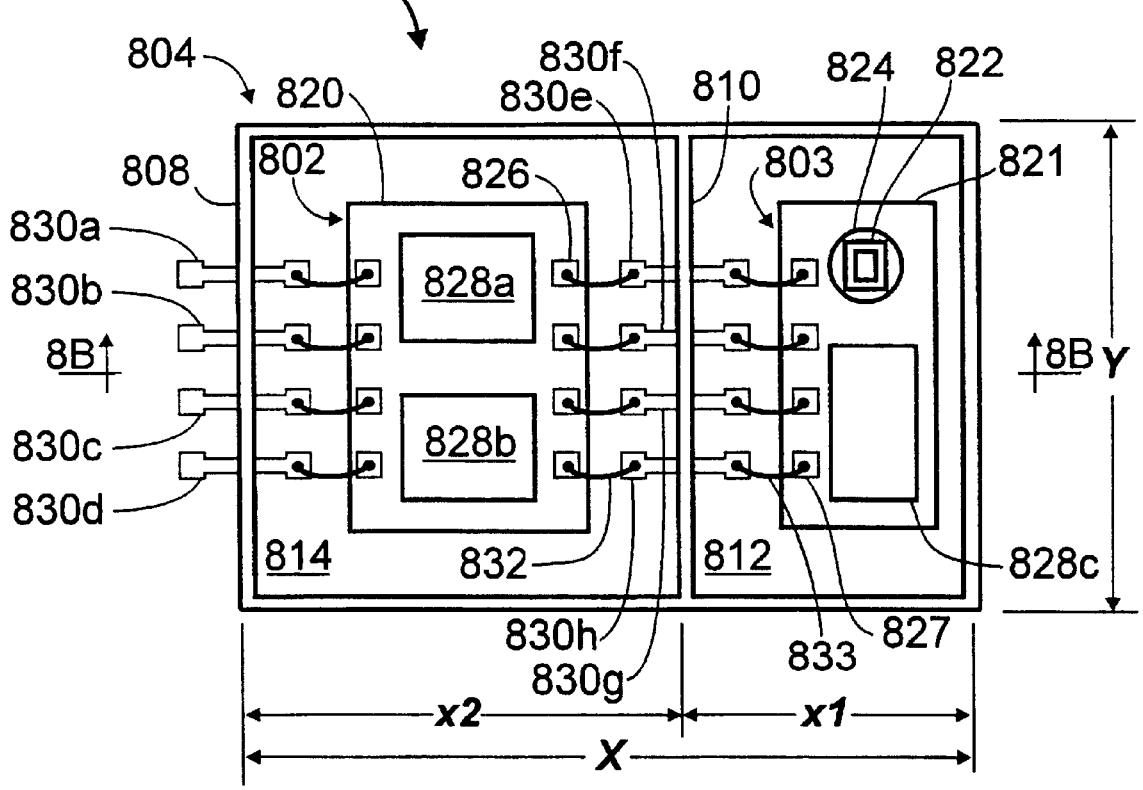
Figure 8B:
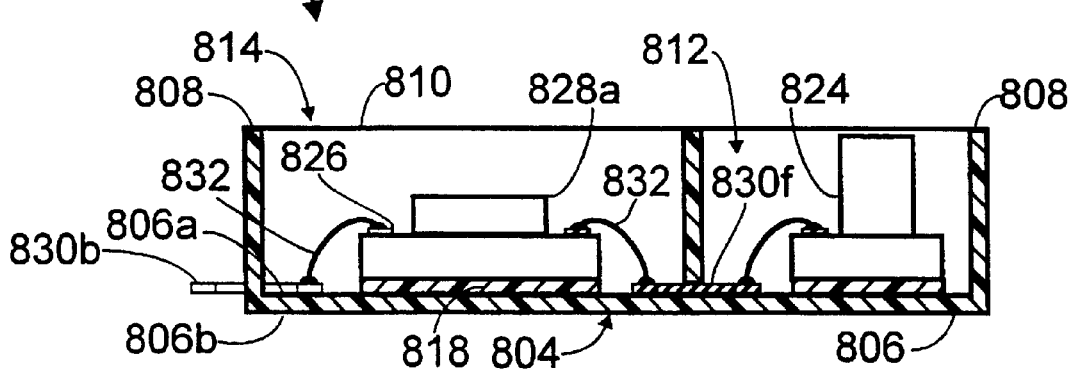
Figure 9A:
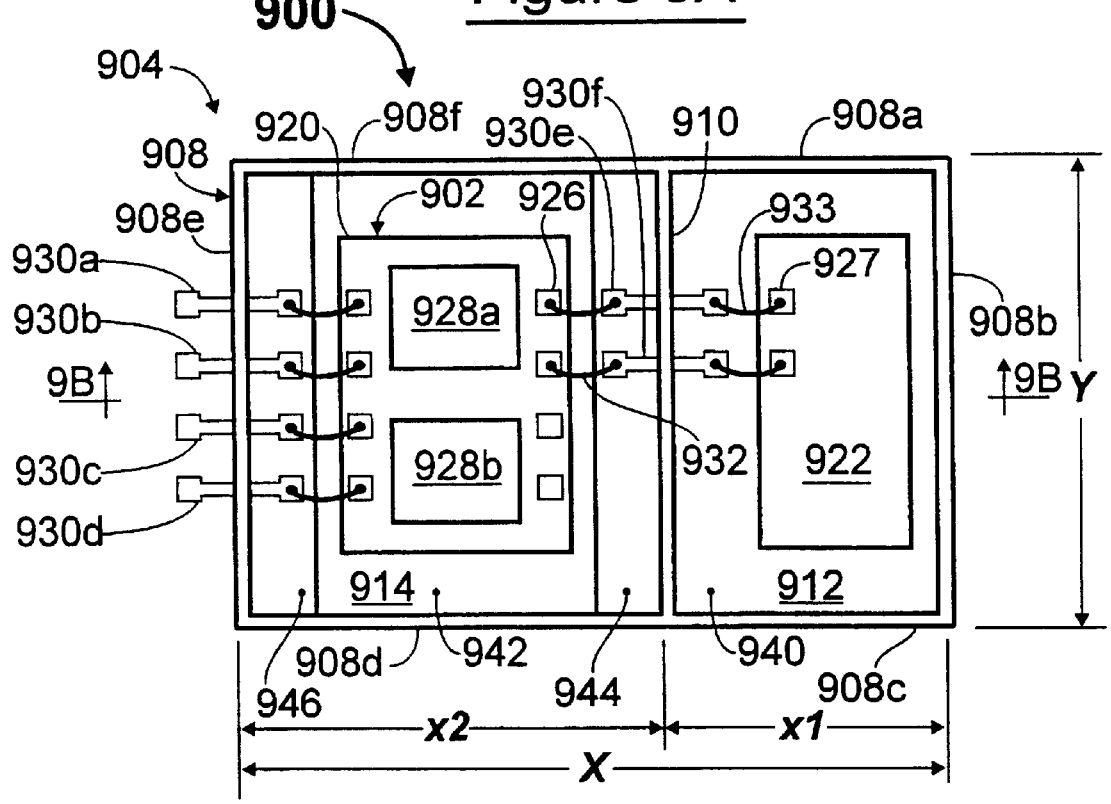
Figure 9B:
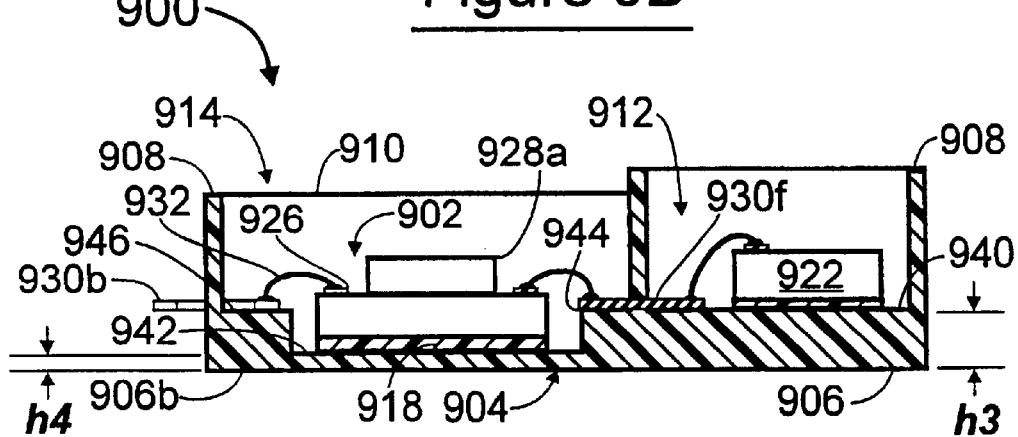
Figure 9C:
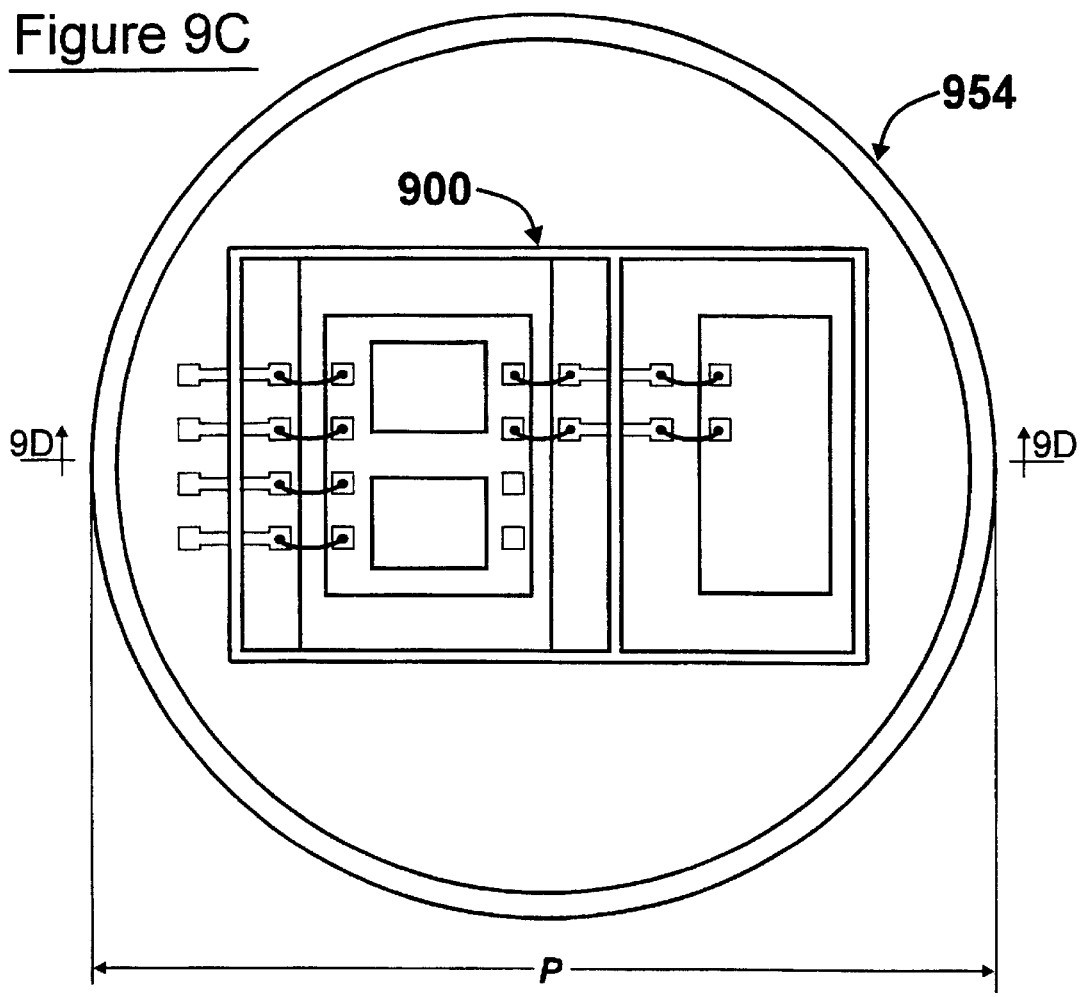
Figure 9D:
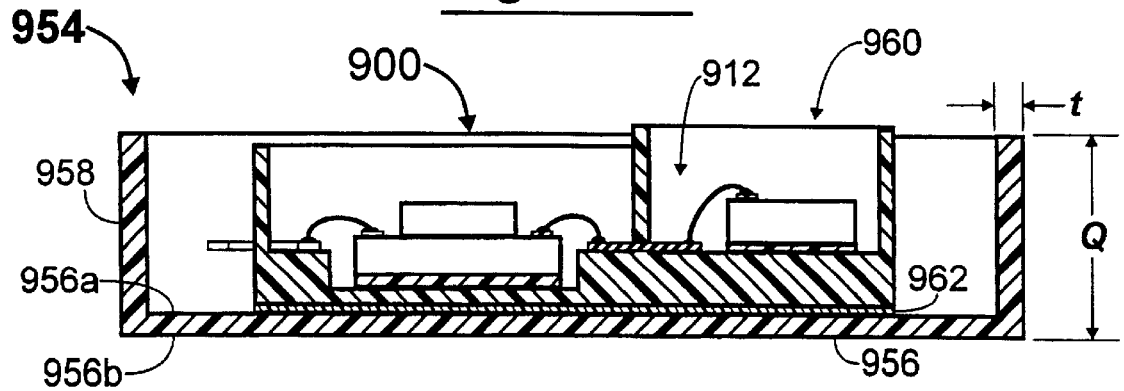
Figure 10A:
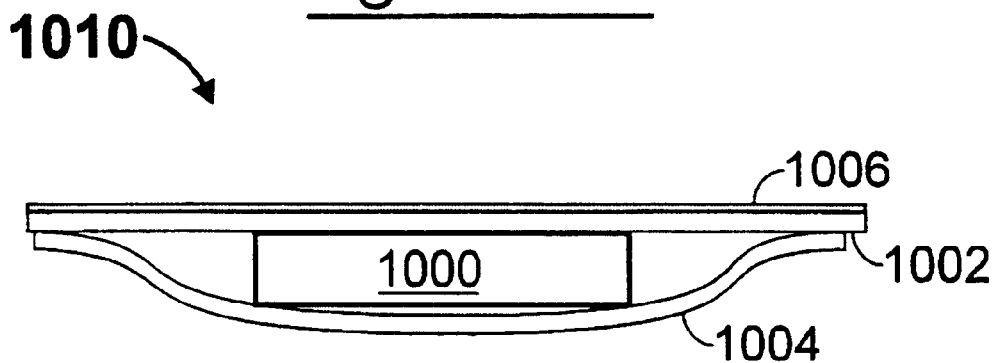
Figure 10B:
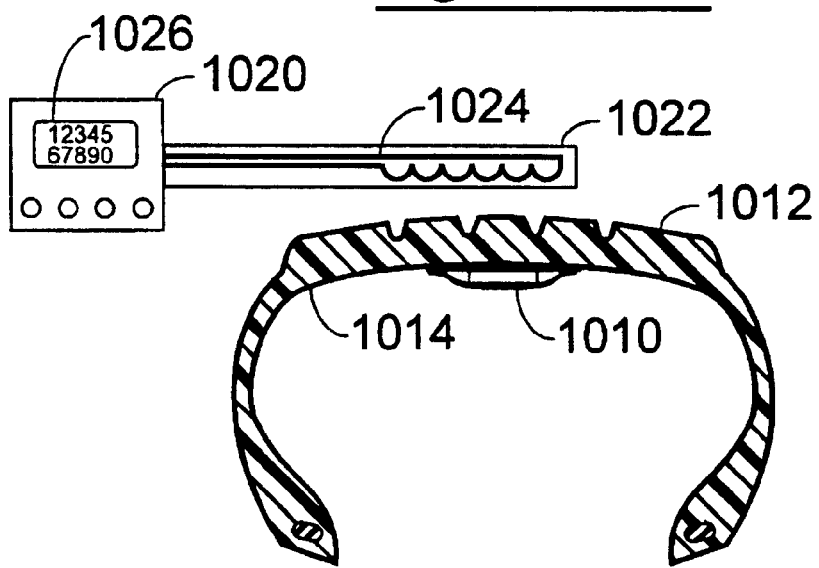

FIG. 5A is a top plan view of an embodiment of the encapsulation package assembly of the present invention, similar to the embodiment shown in FIG. 1A with an additional electronic component disposed in an outer chamber of the package;

FIG. 5B is a side cross-sectional view of the encapsulation package assembly of FIG. 5A, taken on a line 5B—5B through FIG. 5A, according to the invention FIG. 6A is a top plan view of an embodiment of the encapsulation package assembly of the present invention, similar to the embodiment shown in FIG. 5A with an additional electronic component disposed outside of the package and connected to a circuit module which is within the package;

FIG. 6B is a side cross-sectional view of the encapsulation package assembly of FIG. 6A, taken on a line 6B—6B through FIG. 6A, according to the invention;

FIG. 6C is a side view of the an encapsulation package assembly of FIG. 6B, taken on a line 6C—6C, according to the invention;

FIGS. 7A–7D are cross-sectional views of a technique for filling the chambers of the an encapsulation package assembly of the present invention with potting compound(s);

FIG. 8A is a top plan view of an alternate embodiment of the encapsulation package assembly of the present invention;

FIG. 8B is a side cross-sectional view of the encapsulation package assembly of FIG. 8A, taken on a line 8B—8B through FIG. 8A, according to the invention;

FIG. 9A is a top plan view of an alternate embodiment of the encapsulation package assembly of the present invention;

FIG. 9B is a side cross-sectional view of the encapsulation package assembly of FIG. 9A, taken on a line 9B—9B through FIG. 9A, according to the invention;

FIG. 9C is a top plan view of a technique for further packaging the encapsulation package assembly of the present invention;

FIG. 9D is a side cross-sectional view of the further packaged encapsulation package assembly of FIG. 9C, taken on a line 9D—9D through FIG. 9C, according to the invention;

FIG. 10A is a side cross-sectional view of a technique for preparing the encapsulation package assembly of the present invention for assembly to a monitored object, such as a pneumatic tire; and FIG. 10B is a schematic illustration of the encapsulation package assembly of the present invention assembled to a monitored object, such as a pneumatic tire, according to the invention.

DETAILED DESCRIPTION OF THE INVENTION

FIGS. 1A and 1B illustrate an embodiment an encapsulation package assembly 100 of the present invention. In this, and in subsequently-described embodiments, the drawings and accompanying descriptions thereof are also illustrative of techniques for packaging electronic modules and components. For example, the technique illustrated in FIGS. 1A and 1B generally involves placing (disposing) a circuit module 102 into a cup-like, open-ended container (encapsulation package) 104, so that the circuit module 102 can be encapsulated with a potting compound such as "glob-top" epoxy, and can thereby be protected from adverse effects of being disposed in a harsh environment.

The encapsulation package 104 has a generally planar base portion 106 which may, as illustrated, be in the configuration of a disc, having a circular periphery. The base portion 106 has an inner surface (floor) 106a and an outer surface 106b. An outer sidewall 108 extends upwardly (as best viewed in FIG. 1B) from the periphery of the inner surface 106a of the base portion 106. An inner sidewall 110 extends upwardly (as best viewed in FIG. 1B) from the inner surface 106a of the base portion 106 from a position which is within the periphery of the base portion 106.

In the case that the base portion 106 is in the configuration of a disc, it has an overall outside diameter of "D". The outer sidewall 108 is suitably in the form of a cylindrical ring having a diameter "D" and a height "H". The inner sidewall 110 is suitably in the form of a cylindrical ring having a diameter "d" which is smaller than the diameter "D" of the outer sidewall 108 (i.e., D>d), a height "H" commensurate with (approximately equal to) the height of the outer sidewall 108 and is generally concentric with the outer sidewall 108. In this manner, two chambers (cavities, wells) are formed: an outer annular chamber 112 and an inner cylindrical chamber 114, the space between the inner and outer sidewalls 110 and 108 being approximately constant (i.e., D–d) around their respective circumferences. Both chambers 112 and 114 have a base and sidewalls, and are open at their tops so that they can be filled with encapsulating material, as described in greater detail hereinbelow.

As best viewed in FIG. 1A, the inner sidewall 110 may not be entirely cylindrical, but rather may be provided with a flat portion 116 spanning approximately one quarter (90°) of the circumference of the inner wall 110 in a chord-like manner. In this case, as illustrated, the space between the inner and outer sidewalls 110 and 108 is greater in the region of the flat portion 116 of the inner sidewall 110. As will be described in greater detail hereinbelow, providing the inner sidewall 110 with a flat portion 116 enhances the utility of (applications for) the encapsulation package 104.

The encapsulation package 104 is suitably formed, using well-known techniques, from a plastic material such as thermoset epoxy, polyphenylene sulfide, Ryton TM, or the like, by an injection molding process, and the base portion 106, outer sidewall 108 and inner sidewall 110 may all have the same thickness. Exemplary dimensions (expressed in millimeters, "mm") for the encapsulation package 104 are as follows:

(a) the diameter "D" of the base portion 106 (and of the outer sidewall 108) is in the range of from 25.0 mm to 50.0 mm, such as 32.0 mm;
(b) the diameter "d" of the inner sidewall 110 is in the range of from 10.0 mm to 40.0 mm, such as 20.0 mm;
(c) the height "H" of the inner and outer sidewalls 108 and 110, respectively, is in the range of from 3.0 mm to 6.0 mm, such as 5.0 mm; and
(d) the thickness of the base portion 106, the outer sidewall 108 and the inner sidewall 110 is in the range of from 1.0 mm to 2.0 mm, such as 1.5 mm.

It should clearly be understood that the encapsulation package 104 of the present invention is not limited to the dimensions set forth immediately hereinabove. The encapsulation package 104 can be larger, or smaller than described.

Nor is it essential that the outer and inner sidewalls 108 and 110, respectively, have the same heights. For example, the outer sidewall 108 can be shorter than the inner sidewall 210, and vice-versa.

Nor is the encapsulation package 104 of the present invention limited to having a base portion 106 with a disc-like configuration. The configuration of the base portion 106 can be rectangular, triangular, trapezoidal, or the like.

Nor is it mandatory that the encapsulation package 104 of the present invention be formed of a thermoplastic material. Other materials, including insulating and conductive materials may be used. For example, the encapsulation package 104 could readily be formed from two punched-out metal cups, one having a smaller diameter than the other, which are spot welded together at their base portions. Generally, however, if the encapsulation package were to be made from a conductive material (e.g., steel), it would generally be preferred to dispose a layer of an insulating material (e.g., parylene) on interior surfaces of the encapsulation package.

Generally, the encapsulation package 104 has two sidewalls 108 and 110 so that the outer and inner chambers 112 and 114, respectively, can separately be filled with potting compound, or with two different potting compounds, as described in greater detail hereinbelow.

The circuit module 102 is disposed within the inner chamber 114 of the encapsulation package 104, and is mounted (as best viewed in FIG. 1B) to the inner surface (floor) 106a of the base portion 106 in any suitable manner, such as with an adhesive 118. A suitable adhesive 118 is epoxy.

The circuit module 102 suitably, but not necessarily, comprises an interconnection substrate 120 such as a printed circuit board (PCB), such as a reinforced epoxy laminate having a thickness of twenty mils, and having a glass transition temperature exceeding 175° C. A suitable and preferred material for the PCB is available as "high performance" FR-4 epoxy laminate, grade 65M90, sold by Westinghouse Electric Corporation, Copper Laminates Division, 12840 Bradley Avenue, Sylmar, Calif. 91342.

As best viewed in FIG. 1A, an electronic component 122 is disposed on (mounted to) the front (top, as viewed in FIG. 1B) surface of the PCB 120. For purposes of this discussion, the electronic component 122 is a pressure sensor, and it is desired that the electronic component 120 not be covered by potting compound filling the inner chamber 114. To this end, a cylindrical "dam" 124 (e.g., a plastic cylinder) is disposed about the electronic component 122, oriented with its axis normal to the surface of the PCB 120 (and normal to inner surface 106a of the base portion 106 of the encapsulation package 104), and extending upward (as viewed in FIG. 1B) to a position which is approximately coplanar with the top (as viewed in FIG. 1B) edge of the inner sidewall 110.

The electronic component 122 is connected in any suitable manner to the PCB 120. As is known, PCBs typically are provided with one or more layers of conductive traces, at least one of which is on a surface thereof, for routing signals between various electronic components mounted to the PCB, and are often provided with conductive pads (terminals) to which connections to other (external) electronic components and/or systems can be effected. In this case, the PCB 120 is shown as being provided with a plurality (eight of many shown) of pads 126. For purposes of illustrative clarity, conductive traces on the surface of the PCB are omitted, and only one other (i.e., other than the electronic component 122) electronic component 128 is shown mounted to the PCB 120. One having ordinary skill in the art to which this invention most nearly pertains will appreciate that additional electronic components (not shown) can be mounted to the PCB 120 and interconnected with one another to form various electronic circuits having various functions and purposes.

FIGS. 1A and 1B illustrate a leadframe component, generally designated by the reference numeral "130"), disposed within the encapsulation package 104 on the inner surface 106a of the base portion 106, and having a plurality (eight of many shown) of elongate leadframe "fingers" (conductive ribbon-like elements) 130a . . . 130h. Each leadframe finger 130(a . . . h) has two opposite ends, either (or both) of which may (or may not) be broader (wider) than a central portion of the leadframe finger 130. An outer end of a leadframe finger 130 is within the outer chamber 114, an inner end of a leadframe finger 130 is within the inner chamber 112, and the leadframe fingers 130 thus extend from within the outer chamber 112, through the inner sidewall 110, to within the inner chamber 114.

It is within the scope of the invention that the leadframe has any of a variety of patterns of conductors, not only in the form of elongate "fingers". It is preferred that none of the conductive paths of the leadframe crossover one another. If complex interconnections requiring cross-overs are needed, a multi-layer interconnection substrate could be substituted for the leadframe component.

As best viewed in FIG. 1B, the leadframe is suitably molded into the encapsulation package 104, preferably directly on the inner surface (floor) 106a of the bottom portion 106. Generally, in the process of molding the encapsulation package 104, individual leadframe fingers 130a . . . 130h could be held in position with respect to one another (i.e., stabilized) by a thin (e.g., 0.005 inch) layer or film (not shown) of insulating material such as Kapton. Alternatively, the leadframe fingers 130a . . . 130h are held in position with respect to one another by additional portions (not shown) of the leadframe which can be excised after molding.

It should be understood that in this embodiment, and in other embodiments described hereinbelow (for example, as shown in FIGS. 4A and 9A), that portions (e.g., leadframe fingers) of the leadframe component (130) may extend through the outer sidewall (108) of the package 104 to permit the leadframe to be held (clamped) in place while a mold (not shown) is clamped down around the leadframe component for molding the package (104).

As best viewed in FIG. 1B, the pads 126 of the PCB 120 are suitably electrically connected to respective ones of the inner ends of the leadframe fingers (only the leadframe fingers 130b and 130f are visible in FIG. 1B) by any suitable means, such as with bond wires 132, using conventional wirebonding equipment to effect a thermocompressive wedge or ball bond between the bond wires 132 and the leadframe fingers and PCB pads. Suitable material for the bond wires 132 includes gold and alloys thereof in the form of a wire having a diameter of from 0.7 mils to 3.0 mils.

In an illustrative application for the present invention, the circuit module 102 is a RF-transponder, the electronic component 122 is a pressure sensor component, the electronic component 128 is an integrated circuit, and the encapsulation package 104 (with transponder and pressure sensor) is mounted within a pneumatic tire to provide tire pressure information to an external reader/interrogator or to a driver of a vehicle riding on the tire.

In certain applications, such as the circuit module 102 being an RF-transponder having a pressure sensor 122, and the encapsulation package 102 being mounted within a pneumatic tire, it is desirable both to (i) encapsulate the circuit module 102 to protect at least a portion of its components from harsh ambient conditions (e.g., moisture, dirt, etc), and (ii) to calibrate or personalize the circuit module 102 prior to mounting it within the pneumatic tire.

The inventors have constructed prototype RF transponders, such as that described hereinabove, and have discovered that even though the pressure sensor 122 is shielded (by the dam 124) from direct contact with the encapsulant (potting compound), as the encapsulant cures it can exert undesirable stresses on the pressure sensor 122, thereby throwing off its pre-encapsulated calibration.

It is therefore a principal object of this invention to provide a technique for partially encapsulating a circuit module 102, then calibrating the circuit module 102, then completing the encapsulation of the circuit module 102. The encapsulation of the circuit module 102 within the encapsulation package 104 is described in greater detail, hereinbelow.

An Alternate Embodiment

An encapsulation package 104 having an inner generally-cylindrical chamber 114 within an outer annular chamber 112 has been discussed hereinabove. It is within the scope of this invention that the inner and outer chambers can both be rectangular.

FIG. 2A illustrates an alternate embodiment of the encapsulation package assembly 200 of the present invention. As with the previous embodiment 100, the present embodiment 200 generally involves placing a circuit module 202 (compare 202) into a cup-like, open-ended container (encapsulation package) 204 (compare 104), so that the circuit module 202 can be encapsulated with a potting compound and protected from the environment.

Generally, as best viewed in FIG. 2A, a principal difference between the encapsulation package 104 of the previously-described embodiment and the encapsulation package 204 of the present embodiment is that, in the present embodiment the outer and inner sidewalls 208 (compare 108) and 210 (compare 110) are rectangular in plan view, rather than circular (or approximately circular).

As best viewed in FIG. 2B, another difference between the encapsulation package 104 of the previously-described embodiment and the encapsulation package 204 of the present embodiment is that, in the present embodiment the dam 224 (compare 124) disposed about the electronic component 222 (compare 122) is advertently made to extend higher, by a distance "h1" than the height "H'" of the sidewalls 208 and 210.

As in the previously-described embodiment, in this embodiment the encapsulation package 204 has a generally planar base portion 206 (compare 106) which may (as best viewed in FIG. 2A) be in the configuration of a rectangle, having an inner surface (floor) 206a (compare 106a) and an outer surface 206b (compare 106b). An outer sidewall 208 (compare 108) extends upwardly (as best viewed in FIG. 2B) from the periphery of the inner surface 206a of the base portion 206. An inner sidewall 210 (compare 110) extends upwardly (as best viewed in FIG. 2B) from the inner surface 206a of the base portion 206 from a position which is within the periphery of the base portion 206.

The base portion 206 is in the configuration of a rectangle, and has a base length dimension "B" and a base width dimension "W". The length "B" may or may not be equal to the width "W". The outer sidewall 208 is suitably in the form of a rectangular ring having a height "H'". The inner sidewall 210 is suitably in the form of a rectangular ring having a base length dimension "b" smaller the base length dimension "B" of the outer sidewall 208 (B>b), and a width dimension "w" smaller than the width dimension "W" of the outer sidewall 208 (W>w), and has a height "H'" which is approximately equal to the height of the outer sidewall 208. In this manner, two chambers are formed: an outer chamber 212 (compare 112) and an inner chamber 214 (compare 114).

As in the previously-described embodiment, in this embodiment the encapsulation package 204 is suitably formed from a thermoplastic material by a molding process, and the base portion 206, outer sidewall 208 and inner sidewall 210 may all have the same thickness. Exemplary dimensions for the encapsulation package 104 are as follows:

(a) the base length dimension "B" of the base portion 206 (and of the outer sidewall 208) is in the range of from 25.0 mm to 50.0 mm, such as 32.0 mm;

(b) the base length dimension "b" of the inner sidewall 210 is in the range of from 20.0 mm to 40.0 mm, such as 25.0 mm;

(c) the base width dimension "W" of the base portion 206 (and of the outer sidewall 208) is in the range of from 25.0 mm to 50.0 mm, such as 32.0 mm;

(d) the width dimension "d" of the inner sidewall 210 is in the range of from 20.0 mm to 40.0 mm, such as 25.0 mm;

(e) the height "E'" of the inner and outer sidewalls 208 and 210, respectively, is in the range of from 3.0 mm to 6.0 mm, such as 5.0 mm; and (f) the thickness of the base portion 206, the outer sidewall 208 and the inner sidewall 210 is in the range of from 1.0 mm to 2.0 mm, such as 1.5 mm.

It should clearly be understood that, as in the previously-described embodiment, the encapsulation package 204 of the present invention is not limited to the dimensions set forth immediately hereinabove. The encapsulation package 204 can be larger, or smaller than described.

Nor, as in the previously-described embodiment, is it essential that the outer and inner sidewalls 208 and 210, respectively, have the same heights. For example, the outer sidewall 208 can be shorter than the inner sidewall 210, and vice-versa.

Nor, as in the previously-described embodiment, is it mandatory that the encapsulation package 104 of the present invention be formed of a thermoplastic material.

Generally, the encapsulation package 204 has two sidewalls 208 and 210 so that the outer and inner chambers 212 and 214, respectively, can separately be filled with potting compound, or with two different potting compounds, as described in greater detail hereinbelow.

As in the previously-described embodiment, the circuit module 202 is disposed within the inner chamber 214 of the encapsulation package 204, and is mounted (as best viewed in FIG. 2B) to the inner surface 206a of the base portion 206 with a suitable adhesive 218 (compare 118).

As in the previously-described embodiment, the circuit module 202 may comprises a PCB interconnection substrate 220 (compare 120) with an electronic component 222 (compare 122) and another electronic component 228 (compare 128) disposed on its front surface, and the electronic component 222 may be a pressure sensor surrounded by a dam 224 (compare 124) to prevent the sensor from being covered when the inner chamber 214 is filled with potting compound.

As in the previously-described embodiment, pads 226 (compare 126) of the PCB 220 are connected with bond wires 232 (compare 132) to inner ends of a plurality of elongate leadframe "fingers" 130a . . . 130h (compare 130a . . . 130h) which extend from within the inner chamber 214, through the inner sidewall 210 to within the outer chamber 212.

As in the previously-described embodiment, the circuit module 202 may be an RF-transponder, the electronic component 222 may be a pressure sensor component, the electronic component 228 may be an integrated circuit, and the encapsulation package 204 may be mounted within a pneumatic tire.

An Alternate Embodiment

Encapsulation packages (104 and 204) having inner (110, 210) and outer (108, 208) sidewalls of the same height (H, H') have been discussed hereinabove. It is within the scope of this invention that the inner and outer sidewalls of the encapsulation package can have different heights than one another.

FIG. 3 illustrates, in cross-section, another alternate embodiment of an encapsulation package assembly 300 (compare 100, 200) including an encapsulation package 304 which may be circular (compare 104) or rectangular (compare 204). The principal difference illustrated in this embodiment is that the inner sidewall 310 (compare 110, 210) extends to a height which is higher, by a distance "h2" than the height H" of the outer sidewall 308 (compare 108, 208). In other words, a feature of this embodiment is that the sidewall 310 extends further from the inside surface 306a of the base portion 306 than the sidewall 308. In all other respects, the encapsulation package 304 is similar to the previously-described encapsulation packages 104 and 204, having a generally planar base portion 306 (compare 106, 206) having an inner surface 306a (compare 106a, 206a) and an outer surface 306b (compare 106b, 206b). The outer sidewall 308 extends upwardly from the periphery of the inner surface 306a of the base portion 306. The inner sidewall 310 extends upwardly from the inner surface 306a of the base portion 306 from a position which is within the periphery of the base portion 306. In this manner, two chambers are formed: an outer chamber 312 (compare 112, 212) and an inner chamber 314 (compare 114, 214), each of which may separately be filled with potting compound, as described in greater detail hereinbelow.

As in the previously-described embodiments (100, 200), a circuit module comprising a PCB interconnection substrate 320 (compare 120, 220) is mounted to the inner surface 306a of the base portion 306 with a suitable adhesive 318 (compare 118, 218). The PCB interconnection substrate 320 has an electronic component (not visible, compare 122, 222) disposed on its front surface and surrounded by a dam 324 (compare 124, 224), and has another electronic component 328 (compare 128, 228) mounted on its front surface. Conductive pads 326 (compare 126, 226) on the PCB 320 are connected with bond wires 332 (compare 132, 232) to inner ends of a plurality of elongate leadframe "fingers" (compare 130a . . . 130h, 230a . . . 230h), only two of which 330b and 330f are visible in this view, which extend from within the inner chamber 314, through the inner sidewall 310 to within the outer chamber 312.

As in the previously-described embodiments (100, 200), the circuit module 302 may be an RF-transponder, the electronic component 322 may be a pressure sensor component, the electronic component 328 may be an integrated circuit, and the encapsulation package 304 may be mounted within a pneumatic tire.

As in the previously-described embodiments (100, 200), in this embodiment 300 the encapsulation package 304 is suitably formed from a thermoplastic material by a molding process, and the base portion 306, outer sidewall 308 and inner sidewall 310 may all have the same thickness. The encapsulation package 304 may have dimensions comparable to (approximately equal to) those of the previously-described encapsulation packages 104 and 204, as follows:

(a) the height "H''" of the outer sidewall 308 is approximately equal to either the height "H" of the outer sidewall 108 or the height "H'" of the outer sidewall 208;

(b) the cross-dimension (e.g., diameter) of the base portion 306 (and of the outer sidewall 308) is approximately equal to either the dimension "D" of the outer sidewall 108 or the dimensions "B" or "W" of the outer sidewall 208;

(c) the cross-dimension (e.g., diameter) of the inner sidewall 310 is approximately equal to either the dimension "d" of the inner sidewall 110 or the dimensions "b" or "w" of the inner sidewall 210; and (d) the inner sidewall 310 extends a distance "h2" in the range of from 0.2 mm to 0.6 mm, such as 0.4 mm, greater than the height "H''" of the outer sidewall 308.

It should clearly be understood that, as in the previously-described embodiments, the encapsulation package 304 is not limited to the dimensions set forth immediately hereinabove. The encapsulation package 304 can be larger, or smaller than described. Additionally, although the inner sidewall 310 is shown as being higher (taller) than the outer sidewall 308, it is within the scope of the invention that the outer sidewall 308 would be taller than the inner sidewall 310.

An Alternate Embodiment

Encapsulation packages (104, 204, 304) having two chambers, an outer chamber (112, 212, 312, respectively) which surrounds an inner chamber (114, 214, 314, respectively), have been discussed hereinabove. It is within the scope of the invention that an encapsulation package has two (or more) chambers which are adjacent one another.

FIG. 4 illustrates yet another embodiment of an encapsulation package assembly 400 the present invention. As with the previously-described embodiments 100, 200 300, the present embodiment 400 generally involves placing a circuit module 402 into a cup-like, open-ended container (encapsulation package) 404, so that the circuit module 402 can be encapsulated with a potting compound and protected from the environment.

This embodiment 400 is comparable to the embodiment 200 in that the inner chamber 414 (compare 214) is shown as being rectangular, but it may have another shape (e.g., circular, trapezoidal, triangular, etc.)

This embodiment 400 differs from the previously-described embodiments 100, 200 and 300 in that rather than having a single outer chamber (112, 212, 312) surrounding the inner chamber (114, 214, 314) at least one outer chamber 412a or 412b is shown as being disposed adjacent the inner chamber 414. In this illustration, two outer chambers 412a and 412b are shown as being disposed on opposite sides of the inner chamber 414. It is within the scope of the invention that additional outer chambers (not shown) could be disposed on other sides of the inner chamber. For example, a triangular inner chamber could have three outer chambers, one outer chamber disposed adjacent each one of the inner chamber's three sides. Or, a rectangular inner chamber (as shown) could have four outer chambers, one outer chamber disposed adjacent each one of the inner chamber's four sides.

The encapsulation package 404 is similar to the previously-described encapsulation packages 104, 204 and 304 in that is has a generally planar base portion 406 (compare 106, 206, 306) having an inner surface 406a (compare 106a, 206a, 306a) and an outer surface 406b (compare 106b, 206b, 306b). An outer sidewall 408 (compare 108, 208, 308) extends upwardly from the periphery of the inner surface 406a of the base portion 406. A first inner sidewall 410a extends upwardly from the inner surface 406a of the base portion 406 from a first position which is within the periphery of the base portion 406, and a second inner sidewall 410b extends upwardly from the inner surface 406a of the base portion 406 from a second position which is within the periphery of the base portion 406. More particularly, the outer sidewall 408 is rectangular, has four sides 408a, 408b, 408c and 408d, and has an overall width dimension "X" and an overall length dimension "Y" (compare the dimensions "B" and "W").

The first inner sidewall 410a is disposed a distance "x1" inward from a one side 408a of the outer sidewall 408, and extends between an adjacent side 408b of the outer sidewall 408 to another adjacent side 408d of the outer sidewall 408 which is opposite the side 408b of the outer sidewall 408, thereby forming the first outer chamber 412a which has a width dimension "x1" and a length dimension "Y".

The second inner sidewall 410b is disposed a distance "x2" inward from a side 408c of the outer sidewall 408 which is opposite the side 408a of the outer sidewall 408, and also extends between the adjacent side 408b of the outer sidewall 408 to the other adjacent side 408d of the outer sidewall 408 which is opposite the side 408b of the outer sidewall 408, thereby forming the second outer chamber 412b which has a width dimension "x2" and a length dimension "Y".

The first and second inner sidewalls 410a and 410b also define two sides of the inner chamber 414, the other two sides of the inner chamber 414 being defined by central portions of the sides 408b and 408d of the outer sidewall 408, thereby forming an inner chamber 414 which has a width dimension "x" and a length dimension "Y". Evidently, as illustrated, the overall width dimension "X" of the outer sidewall 408 equals the sum of the width dimensions "x1", "x2" and "x" of the first outer chamber 412a, the second outer chamber 412b and the inner chamber 414 respectively.

(X=x1+x2+x)

In this manner, three chambers are formed: two outer chambers 412a and 412b (compare 112, 212, 312) and an inner chamber 414 (compare 114, 214, 314), each of which may contain an electronic component or module, and each of which may separately be filled with potting compound.

As in the previously-described embodiments (100, 200, 300), a circuit module comprising a PCB interconnection substrate 320 (compare 120, 220, 320) is mounted to the inner surface 406a of the base portion 406 with a suitable adhesive 418 (compare 118, 218, 318). The PCB interconnection substrate 420 has an electronic component 422 (compare 122, 222) disposed on its front surface and surrounded by a dam 424 (compare 124, 224, 324), and has another electronic component 428 (compare 128, 228, 328) mounted on its front surface. Conductive pads 426 (compare 126, 226, 326) on the PCB 420 are connected with bond wires 432 (compare 132, 232, 332) to inner ends of a plurality of elongate leadframe "fingers" 408a . . . 408h (compare 130a . . . 130h, 230a . . . 230h). A first portion of the leadframe fingers 430a . . . 430d extend from within the inner chamber 414, through the first inner sidewall 412a, to within the first outer chamber 412a. A second portion of the leadframe fingers 430e . . . 430h extend from within the inner chamber 414, through the second inner sidewall 412b, to within the second outer chamber 412b.

It is within the scope of the invention that, in the case of there being only one outer chamber adjacent the inner chamber (more correctly, this would be considered to be a "first" chamber adjacent a "second" chamber, since there would be no "inner" or "outer" with two side-by-side chambers), all of the leadframe fingers would extend from within the one chamber, through the sidewall separating the two side-by-side chambers, to within the second chamber. Alternatively, some of the leadframe fingers could extend from within one of the first or second chambers to beyond the outer wall of the encapsulation package.

As in the previously-described embodiments (100, 200, 300), the circuit module 402 may be an RF-transponder, the electronic component 422 may be a pressure sensor component, the electronic component 428 may be an integrated circuit, and the encapsulation package 404 may be mounted within a pneumatic tire.

As in the previously-described embodiments (100, 200, 300), in this embodiment 400 the encapsulation package 404 is suitably formed from a thermoplastic material by a molding process, and the base portion 406, outer sidewall 408 and inner sidewalls 410a and 410b may all have the same thickness. The encapsulation package 404 may have dimensions comparable to (approximately equal to) those of the previously-described encapsulation packages 104, 204 and 304, as follows:

(a) the height of the inner and outer sidewalls is approximately equal to either the height "H" of the outer sidewall 108 or the height "H'" of the outer sidewall 208 or the height "H''" of the outer sidewall 308;

(b) the dimensions "x" and "Y" of the inner chamber 414 are approximately equal to the dimension "d" of the inner chamber 114, or the inner dimensions "b" and "w" of the inner chamber 214, or the inner dimension "d''" of the inner chamber 314; and (c) the dimension "x1" is approximately no greater than one-quarter the dimension "X", the dimension "x2" is similarly approximately no greater than one-quarter the dimension "X", and the dimension "x1" is approximately equal to the dimension "x2".

It should clearly be understood that, as in the previously-described embodiments, the encapsulation package 404 is not limited to the dimensions set forth immediately hereinabove. The encapsulation package 404, and portions thereof, can be larger, or smaller than described.

Nor, as in the previously-described embodiment, is it essential that the outer and inner sidewalls 408 and 410a/b, respectively, have the same heights.

Two (or more) Separate, Joinable Chambers

A number of embodiments are described herein where two or more chambers of an encapsulation package are formed as one unitary structure. It is within the scope of this invention that two (or more) chambers of an encapsulation package can separately be formed, then joined together to form a single encapsulation package.

FIG. 4A illustrates an encapsulation package assembly 450 (compare, e.g., 400) having two separate chambers 452 (compare, e.g., 412b) and 454 (compare, e.g., 414). Each chamber 452 and 454 has a base portion 456 and 458, respectively (compare, e.g., 406). For purposes of this description, the base portions 456 and 458 are square.

The chamber 452 has a sidewall 460 extending upwardly (as viewed) from a periphery of its base portion 456. Two of four portions of the sidewall are visible in this figure, which is a "slice"-type cross-sectional view, and are labeled 460a and 460b. As will become evident, when the two chambers 452 and 454 are joined with one another, the sidewall portion 460a will perform the function of an "outer" sidewall portion, and the sidewall portion 460b will perform the function of an "inner" sidewall portion.

In a similar manner, the chamber 454 has a sidewall 462 extending upwardly (as viewed) from a periphery of its base portion 458. Two of four portions of the sidewall are visible in this figure, and are labeled 462a and 462b. As will become evident, when the two chambers 452 and 454 are joined with one another, the sidewall portion 462a will perform the function of an "outer" sidewall portion, and the sidewall portion 462b will perform the function of an "inner" sidewall portion.

FIG. 4A illustrates a representative one of what may be a plurality of elongate members 464 protruding from the inner sidewall portion 462b of the chamber 454 in a direction (towards the left, as viewed in the figure) of the chamber 452, and is shown as being formed with a barb or pawl at its distal end. The elongate member 464 is preferably formed integrally with (e.g., molded together with) the chamber 454. An opening (hole) 466 is formed in the inner sidewall portion 460b of the chamber 452 at a location corresponding to the location of the elongate member 464. In this manner, when the two chambers 452 and 454 are joined with one another, the elongate member 464 will protrude though the opening 466, thereby securing the two chambers 452 and 454 together, with the inner sidewall 460b of the chamber 452 being disposed intimately against (abuts) the inner sidewall 462b of the chamber 454, as illustrated in FIG. 4B. When the chambers 452 and 454 are joined with one another, the outer surfaces of their base portions 456 and 458, respectively, are preferably coplanar with one another.

FIG. 4A also illustrates a representative one of what may be a plurality of leadframe fingers 468 which have been molded into the chamber 454 and, as mentioned hereinabove, which extends through the outer sidewall 462b of the chamber 454. An opening (hole) 470 is formed in the inner sidewall portion 460b of the chamber 452 at a location corresponding to the location of the leadframe finger 468. In this manner, when the two chambers 452 and 454 are joined with one another, the leadframe finger 468 will protrude though the opening 470, into the chamber 452, as illustrated in FIG. 4B.

It should be understood that the illustrations of FIGS. 4A and 4B are shown without any modules or components within the chambers of the encapsulation package, for illustrative clarity. One will also notice that the chamber 454 is illustrated as having higher (taller) sidewalls than the chamber 452, in the manner described hereinabove with respect to FIG. 3.

After joining the two chambers 452 and 454 together, in the manner described hereinabove, they may individually be filled with potting compound (not shown). Evidently, if the chamber 454 is filled to at least the level of the opening (466), the potting compound will serve to secure the distal end of the elongate member 464 in place, within the chamber 454, thereby substantially preventing the two chambers from being separated from one another.

It is within the scope of the invention that an adhesive (not shown) is disposed on one or both of the sidewalls 460b and 462b of the chambers 452 and 454, respectively, prior to assembling the chambers to one another.

The elongate member 464 is shown as being integrally formed with the chamber 454. This is generally preferred in the case that after the two chambers 452 and 454 are assembled to one another, the chamber 454 is filled with encapsulation material (as described hereinbelow) prior to the chamber 452 being filled with encapsulating material. It is, however, within the scope of the invention that the elongate member 464 be integrally formed with the sidewall 460b of the chamber 452, and the opening 466 be formed in the sidewall 462b of the chamber 454.

Adding a Component in the Outer Chamber

As mentioned hereinabove, the circuit module (102, 202, 302, 402) may be a RF-transponder. Such a device typically requires an antenna to communicate with an external reader, examples of which are described in greater detail hereinbelow.

FIGS. 5A and 5B illustrate, in top and side views respectively, an embodiment of an application for the encapsulation package assembly 500 of the present invention. In this application, an encapsulation package 504 of the type described hereinabove with respect to the encapsulation package assembly 100 of FIGS. 1A and 1B is described. In this embodiment, an additional component 550 is disposed within the outer chamber 512 (compare 112) of the encapsulation package 504 (compare 104).

As in the previously-described embodiment (100), in this embodiment 500 the encapsulation package 504 suitably has a generally planar base portion 506 (compare 106) having an inner surface 506a (compare 106a) and an outer surface 506b (compare 106b). An outer sidewall 508 (compare 108) extends upwardly (as best viewed in FIG. 5B) from the periphery of the inner surface 506a of the base portion 506. An inner sidewall 510 (compare 110) extends upwardly (as best viewed in FIG. 5B) from the inner surface 506a of the base portion 506 from a position which is within the periphery of the base portion 506. In this manner, two chambers are formed: an outer chamber 512 (compare 112) and an inner chamber 514 (compare 114) which can separately be filled with potting compound, or with two different potting compounds, as described in greater detail hereinbelow.

As in the previously-described embodiment, a circuit module 502 (compare 102) is disposed within the inner chamber 514 of the encapsulation package 504, and is mounted (as best viewed in FIG. 5B) to the inner surface 506a of the base portion 506 with a suitable adhesive 518 (compare 118).

As in the previously-described embodiment, the circuit module 502 comprises a PCB interconnection substrate 520 (compare 120) with an electronic component 522 (compare 122) and another electronic component 528 (compare 128) disposed on its front surface, and the electronic component 522 may be a pressure sensor surrounded by a dam 524 (compare 124) to prevent the sensor from being covered when the inner chamber 514 is filled with potting compound.

As in the previously-described embodiment, pads 526 (compare 126) of the PCB 520 are connected with bond wires 532 (compare 132) to inner ends of a plurality of elongate leadframe "fingers" 530a . . . 530h (compare 130a . . . 130h) which extend from within the inner chamber 514, through the inner sidewall 510 to within the outer chamber 512.

As in the previously-described embodiment, the circuit module 502 may be an RF-transponder, the electronic component 522 may be a pressure sensor component, the electronic component 528 may be an integrated circuit, and the encapsulation package 504 may be mounted within a pneumatic tire.

The additional component 550 disposed within the outer chamber 512 is suitably a coil antenna—in other words, an antenna formed by a length of insulated (e.g., enamel-coated) wire having two free ends 552 and 554 and wound into a coil having several turns and, optionally several layers. As best viewed in FIG. 5A, the two free ends 552 and 554 of the antenna wire 550 are shown as being connected to portions of the two leadframe fingers 530e and 530f, respectively, which are exposed within the outer chamber 512. These may be simple solder connections. Alternatively (not shown), the exposed portions of the leadframe fingers 530e and 530f can be formed with notches or the like to mechanically "capture" the free ends 552 and 554, respectively, of the antenna wire.

Making Connections to an External Component

In the previously-described embodiment 500, an electronic device which is an RF transponder having an antenna 550 disposed within the outer chamber 512 of the encapsulation package 504 was described. No components external to the package were described.

FIGS. 6A, 6B and 6C illustrate an application wherein an electronic device which is an RF transponder has an antenna component 650 (compare 550) which is external to the encapsulation package.

As in the previously-described embodiment (500), in this embodiment 600 the encapsulation package 604 suitably has a generally planar base portion 606 (compare 506) having an inner surface 606a (compare 506a) and an outer surface 606b (compare 506b). An outer sidewall 608 (compare 508) extends upwardly (as best viewed in FIG. 6B) from the periphery of the inner surface 606a of the base portion 606. An inner sidewall 610 (compare 510) extends upwardly (as best viewed in FIG. 6B) from the inner surface 606a of the base portion 606 from a position which is within the periphery of the base portion 606. In this manner, two chambers are formed: an outer chamber 612 (compare 512) and an inner chamber 614 (compare 514) which can separately be filled with potting compound, or with two different potting compounds, as described in greater detail hereinbelow.

As in the previously-described embodiment, a circuit module 602 (compare 502) is disposed within the inner chamber 614 of the encapsulation package 604, and is mounted (as best viewed in FIG. 6B) to the inner surface 606a of the base portion 606 with a suitable adhesive 618 (compare 518).

As in the previously-described embodiment, the circuit module 602 may comprises a PCB interconnection substrate 620 (compare 520) with an electronic component 622 (compare 522) and another electronic component 628 (compare 528) disposed on its front surface, and the electronic component 622 may be a pressure sensor surrounded by a dam 624 (compare 524) to prevent the sensor from being covered when the inner chamber 614 is filled with potting compound.

As in the previously-described embodiment, pads 626 (compare 526) of the PCB 620 are connected with bond wires 632 (compare 532) to inner ends of a plurality of elongate leadframe "fingers" 630a . . . 630h (compare 530a . . . 530h) which extend from within the inner chamber 614, through the inner sidewall 610 to within the outer chamber 612.

Additionally, as best viewed in FIG. 6A, two separate pads (terminals) 630i and 630j are illustrated. These pads 630i and 630j are suitably formed as part of the overall leadframe. The function of these pads 630i and 630j is discussed in greater detail hereinbelow.

As in the previously-described embodiment, the circuit module 602 may be an RF-transponder, the electronic component 622 may be a pressure sensor component, the electronic component 628 may be an integrated circuit, and the encapsulation package 604 may be mounted within a pneumatic tire.

The antenna component 650 is external to the package 604, and is formed as a length of wire having two free ends 652 and 654. Alteratively, the antenna component 650 may be a dipole-type antenna, having two separate lengths of wire (652 and 654).

As best viewed in FIG. 6C, the free ends 652 and 654 of the external antenna component 650 pass through openings 656 and 658, respectively, in the outer sidewall 608 of the package 604 so that they can be attached to the terminals 630i and 630j, respectively, within the outer chamber 612 of the package 604.

An additional component 660 is optionally disposed within the outer chamber 612 and is suitably an impedance matching transformer having two primary leads 662 and 664 attached (e.g., soldered) to two of the leadframe fingers 630e and 630f, respectively, and having two secondary leads 666 and 668 attached (e.g., soldered) to the two additional terminals 630i and 630j, respectively.

As in the previously-described embodiment (500), certain ones of the leadframe fingers (e.g., 630e and 630f) and additional terminals (630i and 630j) can be formed with notches or the like to mechanically "capture" the various wires which are attached thereto.

Two-Stage Potting Process

As mentioned hereinabove, the encapsulation package assemblies (100, 200, 300, 400, 500, 600) of the present invention have two (or more) distinct chambers, each of which can separately be filled with potting compound, or with two different potting compounds.

FIGS. 7A–7D illustrate a technique 700 for filling the chambers 712 (compare 112) and 714 (compare 114) of an encapsulation package assembly 700 (compare 100) with potting compound. The "model" for describing this technique is the encapsulation package assembly 100 of FIGS. 1A and 1B.

Figure 7A:
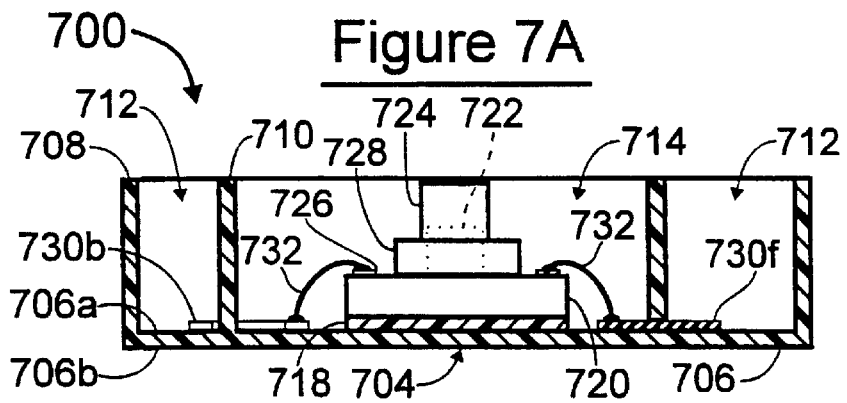

FIG. 7A shows an exemplary encapsulation package 704 (compare 104) having a generally planar base portion 706 (compare 106) having an inner surface (floor) 706a (compare 106a) and an outer surface 106b (compare 106b). An outer sidewall 708 (compare 108) extends upwardly from the periphery of the inner surface 706a of the base portion 706 and an inner sidewall 710 (compare 110) extends upwardly from the inner surface 706a of the base portion 706 from a position which is within the periphery of the base portion 706. In this manner, an inner chamber 714 (compare 114) is formed within an outer chamber 712 (compare 112).

A circuit module 702 (compare 102) comprises a PCB 720 (compare 120) having a component 722 (shown in dashed lines, compare 122) surrounded by a dam structure 724 (compare 124) and another component 728 (compare 728) mounted on a surface thereof. Pads 726 (compare 126) are provided on the surface of the PCB 720. The circuit module 702 is disposed on the inner surface 706a of the base portion 706, using a suitable adhesive 718 (compare 118).

A leadframe is also disposed on the inner surface 706a of the base portion 706 and comprises leadframe fingers 730b (compare 130b) and 730f (compare 130f) extending from the inner chamber 714, through the inner sidewall 710, to within the outer chamber 712. Only these two, of a plurality of leadframe fingers, are visible in this view (compare FIG. 1B). Selected ones of the pads 726 are connected to selected ones of the leadframe fingers with bond wires 732 (compare 132), in the manner described hereinabove.

Figure 7B:
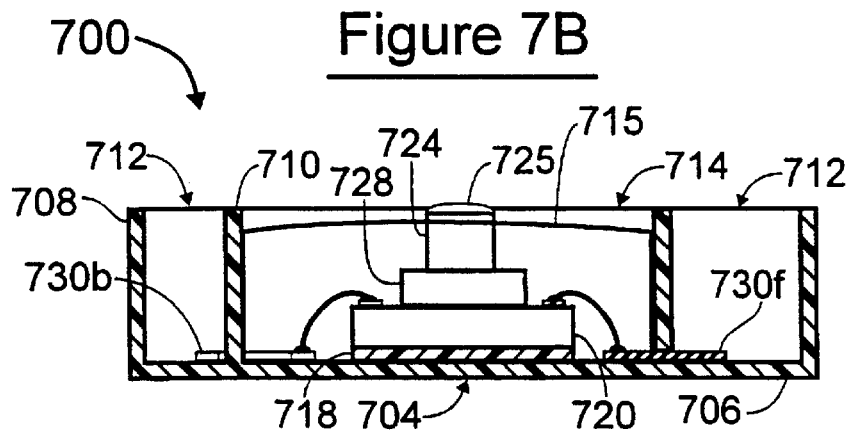

As shown in FIG. 7B, in a first step of encapsulating the electronic components disposed within the encapsulation package 704, the inner chamber 714 is at least partially filled with a quantity of potting compound (encapsulation material) 715 which is sufficient to completely cover portions of the leadframe fingers (730b and 730f) within the inner chamber 714, the printed circuit board 720, the wires 726 and, optionally, the component 728, but not so much that the potting compound 715 "spills" over the inner wall 710 separating the inner chamber 714 from the outer chamber 712. In this figure, the potting compound 715 is shown as having a "positive" meniscus (bowing up in the middle and down at the edges). It is within the scope of this invention that a potting compound having a "negative" meniscus (bowing down in the middle and up at the edges) can be used to encapsulate the circuit module 702 within the inner cavity 714. Optionally, the dam structure 124 may be filled with a silicone gel 725, either before or after filling the inner cavity 714 with the potting compound.

As the potting compound 715 cures, it can shrink and exert physical stress on the encapsulated components, including upon the component 722 which, although not encapsulated by the potting compound per se, is mounted to another component (i.e., the PCB 720) which is subject to the stresses of encapsulant shrinkage. Although the forces generated by the shrinkage may be small, they can adversely affect the performance (or, in the least skew or offset the response) of a stress-sensitive component (722) such as a pressure sensor. Once the potting compound 715 has had sufficient time to cure, whatever stresses are going to be exerted by the potting compound 715 on the components encapsulated-thereby will have leveled out (i.e., become constant and fixed), exhibiting a constant and fixed effect on the pressure-sensitive components within the inner chamber 714.

Figure 7C:
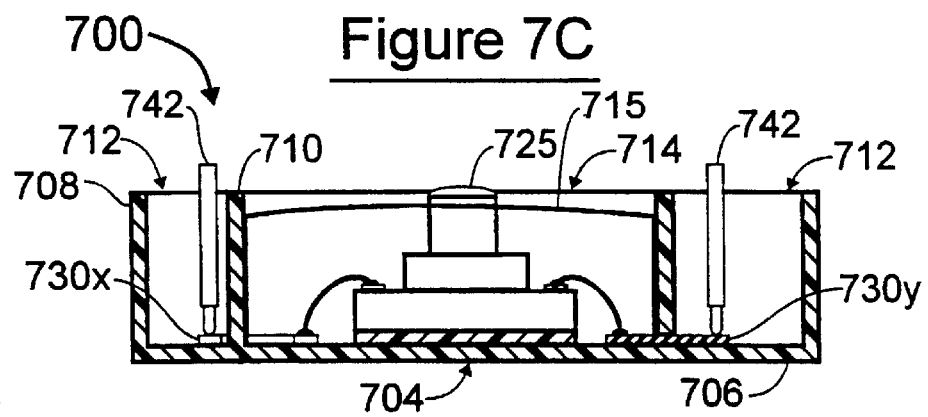

In a next step, shown in FIG. 7C, the components of the circuit module 702 can be electrically exercised (e.g., calibrated), in the following manner. Temporary electrical connections can be made from an external instrumentality (not shown) to selected ones 730x and 730y (labeled as such in this figure since these may not be the fingers 130b and 130f called out in FIG. 7A) of the leadframe fingers with, for example, "pogo" pins 742 and 744, respectively. In this manner, the circuit module 702 can be powered up, and the components of the encapsulated circuit module 702 can be exercised (e.g., calibrated). It should be understood that, although not shown in this figure, either before or after powering up and exercising the encapsulated circuit module, additional components (see, e.g., the antenna 550) can be mounted within the outer chamber 712 and connected (via the leadframe fingers) to the circuit module 702.

Figure 7D:
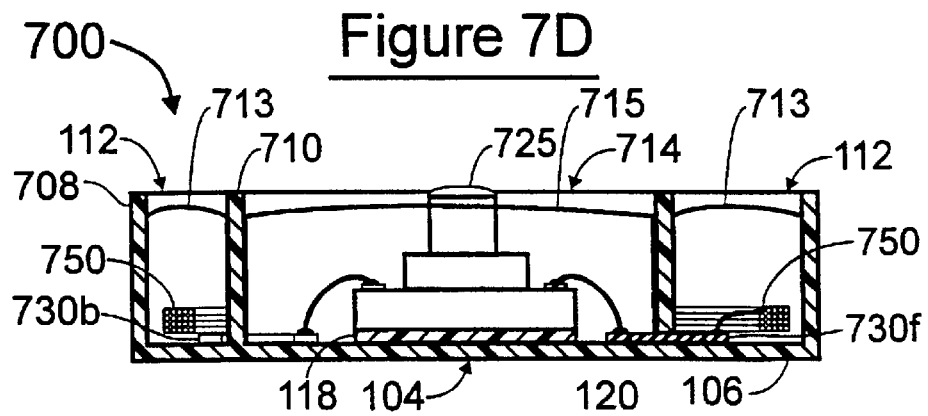

In a final encapsulation step, shown in FIG. 7D, the outer chamber 712 is at least partially filled with a quantity of potting compound (encapsulation material) 713 which is sufficient to completely cover portions of the leadframe fingers (730b and 730f) within the outer chamber 714, the printed circuit board 720, the wires 726 and, optionally, a component 750 (compare 550) mounted within the outer chamber 712, but not so much that the potting compound 713 "spills" over the inner wall 710 separating the inner chamber 714 from the outer chamber 712. In this figure, the potting compound 713 is shown as having a "positive" meniscus, but may have a "negative" meniscus.

The potting compounds 713 and 715 may be the same as one another, or different from one another.

Another Embodiment of an Encapsulation Package Assembly

FIGS. 8A and 8B illustrate yet another embodiment of an encapsulation package assembly 800 the present invention and is comparable to the encapsulation package assembly 400 described with respect to FIG. 4 in that the encapsulation package 804 (compare 404) has two chambers 812 and 814 (compare 412a or 412b, and 414, respectively) which are side-by-side, rather than an outer chamber (e.g., 112, 212, 312) surrounding an inner chamber (e.g., 114, 214, 314). The encapsulation package assembly 800 is shown without the encapsulant, for illustrative clarity, it being understood that the two chambers 812 and 814 can be filled in the manner described hereinabove with potting compound.

The encapsulation package 804 is similar to the previously-described encapsulation packages in that it has a generally planar base portion 806 (compare 406). The base portion 806 has an inner surface 806a and an outer surface 806b. An outer sidewall 808 (compare 408) extends upwardly from the periphery of the base portion 806. An inner sidewall 810 extends upwardly from the base portion 806, and defines and separates the two chambers 812 and 814 from one another. The first chamber 812 has a width dimension "x1" and a length dimension "Y". The second chamber 814 has a width dimension "x2" and a length dimension "Y".

A first circuit module 802 (compare 402) is disposed in the first chamber 814 and is shown as having two electronic components 828a and 828b mounted to a printed circuit board (PCB) 820 (compare 120).

A second circuit module 803 (compare 802) is disposed in the second chamber 812 and is shown as having two electronic components 822 and 828c mounted to a printed circuit board (PCB) 821 (compare 820).

A first portion 830a . . . 830d of the leadframe fingers extend from within the second chamber 814, through the outer sidewall 808 to the exterior of the encapsulation package 804, and a second portion 830e . . . 830h of the leadframe fingers extend from within the second chamber 814, through the inner sidewall 810 to within the first chamber 812.

As in the previously-described embodiments, a first circuit module 802 comprising a first PCB interconnection substrate 820 is mounted within the first chamber 814, and the PCB interconnection substrate 820 may have electronic components 828a and 828b mounted on its front surface. Conductive pads 826 (compare 426) on the PCB 820 are connected with bond wires 832 (compare 432) to inner ends of a plurality of elongate leadframe "fingers" 830a . . . 830h (compare 430a . . . 430h.

In this embodiment, a second circuit module 803 comprising a second PCB interconnection substrate 821 is mounted within the second chamber 812, and the PCB interconnection substrate 821 may have one or more electronic components 824 and 828c mounted on its front surface. Conductive pads 827 (compare 826) on the PCB 821 are connected with bond wires 833 (compare 832) to inner ends of a plurality of elongate leadframe "fingers" 830e . . . 830h.

As in the previously-described embodiments, the circuit module 802 may be an RF-transponder, the electronic component 822 may be a pressure sensor component, the electronic components 828a and 828b may be integrated circuit devices, and the encapsulation package 804 may be mounted within a pneumatic tire.

As in the previously-described embodiments, in this embodiment the encapsulation package 804 is suitably formed from a thermoplastic material by a molding process, and the base portion 806, outer sidewall 808 and inner sidewall 810 may all have the same thickness. The encapsulation package 804 may have dimensions comparable to (approximately equal to) those of the previously-described encapsulation packages 104, 204 and 304, as follows:

(a) the height of the inner and outer sidewalls 808 and 810 is approximately equal to either the height "H" of the outer sidewall 108 or the height "H'" of the outer sidewall 208 or the height "H''" of the outer sidewall 308;

(b) the dimensions "x2" and "Y" of the first chamber 814 are approximately equal to the dimension "d" of the inner chamber 114, or the inner dimensions "b" and "w" of the inner chamber 214, or the inner dimension "d''" of the inner chamber 314; and (c) the dimension "x1" of the second chamber 812 is approximately one-half the dimension "x2".

It should clearly be understood that, as in the previously-described embodiments, the encapsulation package 804 is not limited to the dimensions set forth immediately hereinabove. The encapsulation package 804, and portions thereof, can be larger, or smaller than described.

Nor, as in the previously-described embodiment, is it essential that the outer and inner sidewalls 808 and 810, respectively, have the same heights.

Another Embodiment of an Encapsulation Package Assembly

FIGS. 9A and 9B illustrate yet another embodiment of an encapsulation package assembly 800 the present invention and is comparable to the previously-described encapsulation package assembly 800 in that the encapsulation package 904 (compare 804) has two side-by-side chambers 912 and 914 (compare 812 and 814). The encapsulation package assembly 900 is shown without the encapsulant, for illustrative clarity, it being understood that the two chambers 912 and 914 can be filled in the manner described hereinabove with potting compound.

The encapsulation package 904 is similar to the previously-described encapsulation packages in that is has a generally planar base portion 906 (compare 806). The base portion 906 has an inner surface 906a and an outer surface 906b. As best viewed in FIG. 9B, and as described in greater detail hereinbelow, the base portion 906 is thicker in the chamber 912 than it is in the chamber 914.

An outer sidewall 908 (compare 808) extends upwardly from the periphery of the base portion 906. An inner sidewall 910 (compare 810) extends upwardly from the base portion 906, and defines and separates the two chambers 912 and 914 from one another. The first chamber 912 has a width dimension "x1" and a length dimension "Y". The second chamber 914 has a width dimension "x2" and a length dimension "Y". These dimensions are suitably similar to the dimensions set forth with respect to the previously described embodiment of an encapsulation package assembly 800.

A first circuit module 902 (compare 802) is disposed in the first chamber 914 and is shown as having two electronic components 928a and 928b (compare 828a and 828b) mounted to a printed circuit board (PCB) 920 (compare 820).

A first portion 930a . . . 930d of the leadframe fingers extend from within the second chamber 914, through the outer sidewall 908 to the exterior of the encapsulation package 904, and a second portion 930e . . . 930f of the leadframe fingers extend from within the second chamber 914, through the inner sidewall 910 to within the first chamber 912.

As in the previously-described embodiments, a first circuit module 902 comprising a first PCB interconnection substrate 920 is mounted within the first chamber 914, and the PCB interconnection substrate 820 may have electronic components 928a and 928b mounted on its front surface. Conductive pads 926 (compare 826) on the PCB 920 are connected with bond wires 932 (compare 832) to inner ends of a plurality of elongate leadframe "fingers" 930a . . . 930f.

In this embodiment, an electronic component 922 (compare circuit module 803) is disposed (mounted) in the second chamber 912. Conductive pads 927 (compare 827) on electronic component 922 are connected with bond wires 933 (compare 833) to inner ends of a plurality of elongate leadframe "fingers" 930e . . . 930f.

As in the previously-described embodiments, the circuit module 902 may be an RF-transponder, the electronic component 922 may be a pressure sensor component, the electronic components 928a and 928b may be integrated circuit devices, and the encapsulation package 904 may be mounted within a pneumatic tire.

As in the previously-described embodiments, in this embodiment the encapsulation package 904 is suitably formed from a thermoplastic material by a molding process, and the encapsulation package 904 may have dimensions, most of which are comparable to (approximately equal to) those of the previously-described encapsulation packages.

For example, the height of the inner and outer sidewalls 908 and 910 may be approximately equal to either the height "H" of the outer sidewall 108 or the height "H'" of the outer sidewall 208 or the height "H''" of the outer sidewall 308. However, as best viewed in FIG. 9B, it is preferred that the inner sidewall 910 and those portions 908a, 908b and 908c of the outer sidewall 908 which, together with the inner sidewall 910 bound the chamber 912 are higher than the remaining portions 908d, 908e and 908f of the outer sidewall 908.

The dimensions "x2" and "Y" of the first chamber 914 may be approximately equal to the dimension "d" of the inner chamber 114, or the inner dimensions "b" and "w" of the inner chamber 214, or the inner dimension "d''" of the inner chamber 314, such approximately as 5.1 mm.

The dimension "x1" of the second chamber 912 may be approximately one-half the dimension "x2", such as approximately 10.6 mm. The dimension "X" (X=x1+x2) is suitably approximately 15.7 mm It should clearly be understood that, as in the previously-described embodiments, the encapsulation package 904 is not limited to the dimensions set forth immediately hereinabove. The encapsulation package 904, and portions thereof, can be larger, or smaller than described.

As mentioned hereinabove, the base portion 906 is thicker in the chamber 912 than it is in the chamber 914. More particularly, as best viewed in FIG. 9B, the outer surface 906b of the base portion 906 is generally planar, as in the previously-described embodiments.

In this embodiment, the inner surface 940 of the base portion within the chamber 912, whereupon the electronic component 922 is mounted, is at a distance "h3" above the outer surface 906b of the base portion 906. The inner surface of the base portion within the chamber 914 has a central area 942, whereupon the electronic module 902 is mounted, which is at a distance "h4" above the outer surface 906b of the base portion 906. The distance "h3" is greater than the distance "h4" (h3>h4).

The inner surface of the base portion within the chamber 914 is stepped, so that an area 944 outside of the central area 942 is at a distance "h3" above the outer surface 906b of the base portion 906. In this manner, leadframe fingers (e.g., 930f) extending through the inner sidewall 910 lie in a plane on the inner surface portion 944 of the chamber 914 and the inner surface 940 of the chamber 912. In a similar manner, other portions of the inner surface of the base portion within the chamber, outside of the central area 942, can be stepped, so as to be at a distance "h3" above the outer surface 906b of the base portion 906. In this example, a portion 946 of the inner surface of the base portion within the chamber 914 is stepped, so as to be a distance "h3" above the outer surface 906b of the base portion 906. In this manner, all of the leadframe fingers can be coplanar with one another.

As best viewed in FIG. 9B, this results in the electronic component 922 being disposed at a higher level than the electronic module 902. Importantly, the increased thickness of the base portion in the chamber 912 provides a generally more rigid base for the electronic component 922 to be mounted upon. In the context of the electronic component 922 being a pressure sensor, such as has been described hereinabove, the benefits of the pressure sensor being mounted to a relatively rigid base are evident.

FIGS. 9A and 9B also illustrate the concept, described briefly hereinabove, that portions of the leadframe, in this case the leadframe fingers 930a . . . 930d, may extend to the exterior of the package so that the leadframe can be supported within a mold. In this example, the other leadframe fingers 930e and 930f which do not extend to the exterior of the package can be supported along with the leadframe fingers 930a . . . 930d by an underlying insulating film (not shown), or by metallic webs or bridges (also not shown) which form part of leadframe itself and which may later be excised from the leadframe. One of ordinary skill in the art to which the present invention most nearly pertains will readily understand the need to and numerous ways available for supporting the leadframe within a mold. Inasmuch as the techniques for doing so may vary, from application-to-application, there is no need to further elaborate upon them in the description of the present invention.

Further Packaging of the Encapsulation Package Assembly

FIGS. 9C and 9D illustrate a technique for further packaging of an exemplary encapsulation package assembly 900 of the present invention. The encapsulation package assembly 900 is shown without the encapsulant, for illustrative clarity, it being understood that its two chambers (912 and 914) would be filled in the manner described hereinabove with potting compound(s).

An additional encapsulation package 954 is in the form of a simple cup-like structure, having a generally planar base portion 956. The base portion 956 is suitably circular, having a diameter "P", and has an inner surface 956a and an outer surface 956b. An annular sidewall 958 having a height "Q" extends upwardly from the periphery of the base portion 956. In this manner, a cylindrical chamber 960 is formed. The height "Q" of the sidewall may be equal to, greater than, or (preferably) no greater than the height of the sidewalls of the encapsulation package 904.

The entire encapsulation package assembly 900 is disposed in the chamber 912, as shown, with the outer surface (906b) of the base portion (906) encapsulation package (904) being disposed against the inner surface 956a of the base portion 956 of the additional encapsulation package 954. Any suitable adhesive 962, such as a drop of cyanoacrylate ("super glue"), may be used to join the encapsulation package assembly 900 to the additional encapsulation package 954.

Suitable dimensions for the additional encapsulation package 954 are:
- the diameter "P" of the base portion 956 is in the range of from 25.0 mm to 60.0 mm, such as approximately 32.0 mm;
- the height "Q" of sidewall 958 is in the range of from 3.0 mm to 8.0 mm, such as approximately 4.0 mm; and
- the thickness "t" of the sidewall 958 is in the range of from 0.3 mm to 2.0 mm, such as approximately 1.0 mm.

It should clearly be understood that, as in the previously-described embodiments, the additional encapsulation package 954 is not limited to the dimensions set forth immediately hereinabove. The additional encapsulation package 954, and portions thereof, can be larger, or smaller than described, so long as the encapsulation package assembly 900 fits in the additional encapsulation package 954. The additional encapsulation package 954 is suitably molded from the same materials as the encapsulation packages (e.g., 104) described hereinabove.

An Exemplary Use for the Encapsulation Package Assemblies

FIGS. 10A and 10B illustrate an exemplary use for the various embodiments of the encapsulation package assembly of the present invention. As mentioned hereinabove, an illustrative application for the encapsulation package assembly of the present invention is to house a circuit module (e.g., 102) which is a RF-transponder, wherein the electronic component (e.g., 122) is a pressure sensor component, and the encapsulation package (e.g., 104) is mounted within a pneumatic tire to provide tire pressure information to an external reader/interrogator or to a driver of a vehicle riding on the tire.

FIG. 10A shows an encapsulation package assembly 1000 which may be any of the aforementioned embodiments of an encapsulation package assemblies (100, 200, 300, 400, 450, 500, 600, 700, 800 or 900, including the further encapsulated package 954). The package assembly 1000 is shown as being "sandwiched" between two thin sheets 1002 and 1004, such as rubber sheets, which are pressed to remove air bubbles from between the sheets and sealed around their edges. An adhesive 1006 is disposed on the top (as viewed) surface of the sheet 1002. In this manner, an encapsulated transponder device within a "sandwich" patch 1010 is ready to be mounted to an inside surface of a pneumatic tire. Disposing a transponder device within a "sandwich" patch is well known and does not form a part of the present invention per se.

FIG. 10B shows the sandwich patch 1010 of FIG. 10A mounting within a pneumatic tire 1012, on an inner surface thereof. An external reader/interrogator 1020 having a wand 1022 comprising an antenna 1024 is suitably employed to poll (interrogate) the transponder circuit disposed within the pneumatic tire 1012, and display data retrieved therefrom on a suitable readout 1026 such as a liquid crystal display (LCD) panel. Using an external instrumentality to interact with a transponder device is well known and does not form a part of the present invention per se.

While the invention has been described in combination with embodiments thereof, it is evident that many alternatives, modifications, and variations will be apparent to those skilled in the art in light of the foregoing description. Accordingly, it is intended to embrace all such alternatives, modifications and variations as fall within the spirit and scope of the appended claims.

For example, selected ones of the various features set forth in the various embodiments described hereinabove can be "mixed and matched" so as to arrive at yet another embodiment which incorporates the selected ones of the features. For example, the higher inner sidewall (310) feature of the encapsulation package (304) of the FIG. 3 embodiment could be incorporated with the additional component (550) feature of the encapsulation package 504 of the FIG. 5 embodiment.

What is claimed is:

1. Encapsulation package for sequentially potting a circuit module followed by its electrical connections, the package comprising:

a base having an inner surface and an outer surface opposite the inner surface;

the circuit module disposed on the inner surface of the base, wherein the circuit module requires exercising after being potted;

a first sidewall extending up from the inner surface of the base such that the first sidewall surrounds the circuit module and is open above the circuit module, thereby defining a first chamber;

a second sidewall extending up from the inner surface of the base and defining a second chamber that is open at its top and is separate from the first chamber;

elongate conductive elements forming the electrical connections of the circuit module wherein at least a portion of each of the elongate conductive elements has a one end disposed in the first chamber and an opposite end disposed in the second chamber; such that the circuit module is connected to the one ends of the at least a portion of the elongate conductive elements, wherein the circuit module's electrical connections can at least be used to exercise the circuit module after potting; and potting compound wherein the first chamber and the second chamber are separately and sequentially filled with potting compound at different stages of an encapsulation process which includes exercising the circuit module after filling the first chamber but before filling the second chamber.

2. Encapsulation package, according to claim 1, characterized in that:

the second chamber surrounds the first chamber.

3. Encapsulation package, according to claim 1, characterized in that:

the second chamber is adjacent the first chamber.

4. Encapsulation package, according to claim 1, characterized in that:

the base is in the form of a disc.

5. Encapsulation package, according to claim 1, characterized in that:

the base is in the form of a rectangle.

6. Encapsulation package, according to claim 1, characterized in that:

the first sidewall extends further from the inner surface of the base than the second sidewall.

7. Encapsulation package, according to claim 1, characterized in that:

the second chamber is formed separately from the first chamber; and an inner portion of the second sidewall abuts an inner portion of the first sidewall.

8. Encapsulation package, according to claim 1, further characterized by:

at least one opening extending through the second sidewall.

9. Encapsulation package, according to claim 1, farther characterized by:

the elongate conductive elements comprising a leadframe having a plurality of leadframe fingers, at least a portion of which extend from the first chamber, through the first sidewall into the second chamber.

10. Encapsulation package, according to claim 1, further characterized by:

the elongate conductive elements comprising a leadframe having a plurality of leadframe fingers, at least a portion of which extend through the second sidewall to an exterior of the encapsulation package.

11. Encapsulation package for sequentially potting a circuit module followed by its electrical connections, the package comprising:

a first base having an inner surface and an outer surface opposite the inner surface;

the circuit module disposed on the inner surface of the first base, wherein the circuit module requires exercising after being potted;

a first sidewall extending up from a periphery of the inner surface of the first base such that the first sidewall surrounds the circuit module and is open above the circuit module, thereby defining a first chamber;

a second base that is separate from the first base;

a second sidewall extending up from a periphery of the second base and defining a second chamber that is open at its top;

an inner portion of the first sidewall that is shaped for abutting against an inner portion of the second sidewall;

a means for joining the first chamber and the second chamber with the inner portion of the first sidewall abutting against the inner portion of the second sidewall;

elongate conductive elements forming the electrical connections of the circuit module wherein at least a portion of each of the elongate conductive elements has a one end disposed in the first chamber and an opposite end disposed in the second chamber; such that the circuit module is connected to the one ends of the at least a portion of the elongate conductive elements, wherein the circuit module's electrical connections can at least be used to exercise the circuit module after potting; and potting compound wherein the first chamber and the second chamber are separately and sequentially filled with potting compound at different stages of an encapsulation process which includes exercising the circuit module after filling the first chamber but before filling the second chamber.

* * * * *